(12) United States Patent  (10) Patent No.: US 7,750,859 B2
Rao et al.  (45) Date of Patent: Jul. 6, 2010

(54) GENERIC PICK-UP HORN FOR HIGH POWER THERMAL VACUUM TESTING OF SATELLITE PAYLOADS AT MULTIPLE FREQUENCY BANDS AND AT MULTIPLE POLARIZATIONS

(75) Inventors: Sudhakar K. Rao, Churchville, PA (US); Clency Lee-Yow, Longmont, CO (US); Philip Venezia, Longmont, CO (US); Mark W. MacGregor, Wyndmoor, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 166 days.

(21) Appl. No.: 12/016,930

(22) Filed: Jan. 18, 2008

(65) Prior Publication Data
US 2008/0191949 A1   Aug. 14, 2008

Related U.S. Application Data

(63) Continuation-in-part of application No. 11/446,974, filed on Jun. 6, 2006, now Pat. No. 7,598,919.

(60) Provisional application No. 60/758,940, filed on Jan. 12, 2006, provisional application No. 60/907,476, filed on Apr. 3, 2007.

(51) Int. Cl.
H01Q 13/02 (2006.01)

(52) U.S. Cl. ...................... 343/703; 343/786
(58) Field of Classification Search .............. 343/703, 343/772, 786, 776
See application file for complete search history.

(56) References Cited

U.S. PATENT DOCUMENTS

| 3,553,707 | A |   | 1/1971  | Yang et al. |
| 3,745,291 | A | * | 7/1973  | Peterson et al. ............. 219/748 |
| 3,908,189 | A |   | 9/1975  | Buehler et al. |
| 4,164,718 | A |   | 8/1979  | Iwasaki |
| 4,319,248 | A |   | 3/1982  | Flam |
| 4,554,552 | A |   | 11/1985 | Alford et al. |
| 4,645,358 | A |   | 2/1987  | Blume |

(Continued)

FOREIGN PATENT DOCUMENTS

EP   1006049 A2   6/2000

(Continued)

Primary Examiner—HoangAnh T Le
(74) Attorney, Agent, or Firm—McDermott Will & Emery LLP

(57) ABSTRACT

Methods, systems, and apparatus are disclosed for high power thermal vacuum testing of satellite payloads using pick-up horns. Such pick-up horns can include at least one outer metal wall forming a metal body and at least one interior surface disposed in the metal body, forming at least one chamber in the metal body. The pick-up horn further includes a front metal surface disposed at a front end of the metal body, having at least one opening corresponding to the at least one chamber, and at least one high-power absorbing load disposed within the at least one chamber and in contact with the at least one interior surface. A pick-up horn may further include a serpentine coolant path disposed within the metal body between an outer surface of the at least one outer metal wall and the at least one high-power absorbing load. Related systems and methods are described.

44 Claims, 18 Drawing Sheets

U.S. PATENT DOCUMENTS

| | | | |
|---|---|---|---|
| 5,039,949 | A | 8/1991 | Hemming et al. |
| 5,113,190 | A | 5/1992 | Klein |
| 5,188,862 | A | 2/1993 | Itatani et al. |
| 5,631,661 | A | 5/1997 | Sanchez |
| 5,847,681 | A | 12/1998 | Faherty et al. |
| 5,963,176 | A | 10/1999 | Solheim et al. |
| 6,075,495 | A | 6/2000 | Podgorski |
| 6,295,032 | B1 | 9/2001 | Podgorski |
| 6,567,046 | B2 | 5/2003 | Taylor et al. |
| 6,611,238 | B1 | 8/2003 | Santoru et al. |
| 2002/0044094 | A1 | 4/2002 | May |
| 2002/0080081 | A1 | 6/2002 | Liu |
| 2003/0080914 | A1 | 5/2003 | Eom et al. |
| 2004/0113853 | A1 | 6/2004 | Serban et al. |
| 2004/0222934 | A1* | 11/2004 | Wu .............................. 343/786 |
| 2005/0017916 | A1* | 1/2005 | Lewry et al. ................ 343/786 |
| 2005/0030241 | A1 | 2/2005 | Brown et al. |
| 2005/0099345 | A1 | 5/2005 | Von Klilzing et al. |
| 2005/0110695 | A1 | 5/2005 | Jung et al. |
| 2005/0212712 | A1 | 9/2005 | Pryor et al. |
| 2005/0259025 | A1 | 11/2005 | Cook |
| 2005/0280595 | A1 | 12/2005 | Chew et al. |
| 2006/0262021 | A1 | 11/2006 | Matsui |
| 2007/0188396 | A1 | 8/2007 | Greissbaum et al. |

FOREIGN PATENT DOCUMENTS

| | | | |
|---|---|---|---|
| EP | 1603192 | A1 | 12/2005 |
| WO | WO-2005-050255 | A2 | 6/2005 |

* cited by examiner

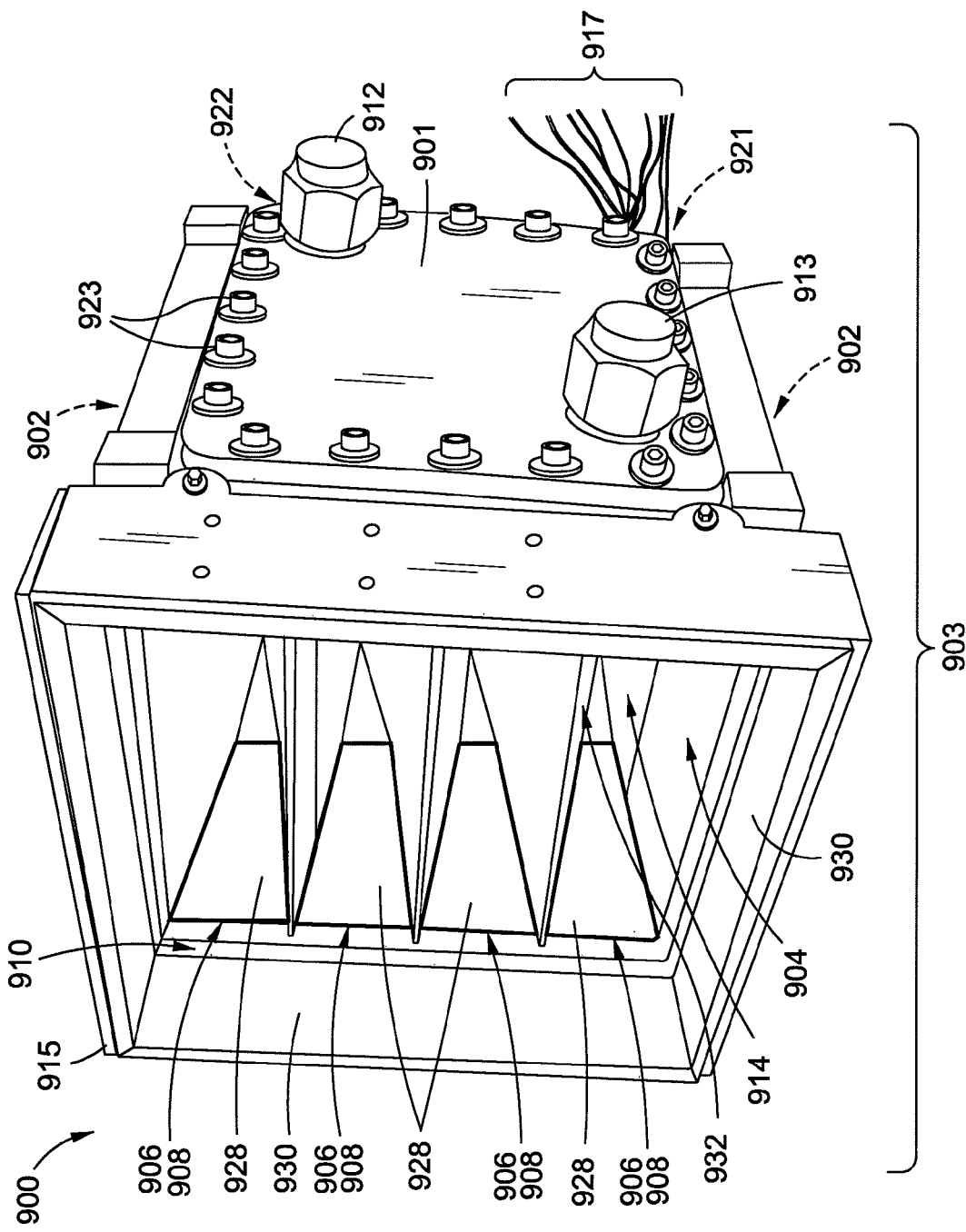

HOM POWER DISTRIBUTION

1200A →

| PUH SLOT | PERCENT POWER TE10 | PERCENT POWER TE30 | PERCENT POWER TE11 | PERCENT POWER TM11 | PERCENT POWER IN SLOT |
|---|---|---|---|---|---|
| 1 | 1.58 | 0.05 | 1.58 | 0.03 | 3.25 |
| 2 | 37.15 | 5.62 | 0.32 | 3.02 | 46.11 |
| 3 | 37.15 | 5.62 | 0.32 | 3.02 | 46.11 |
| 4 | 1.58 | 0.05 | 1.58 | 0.03 | 3.25 |
| TOTAL | 77.48 | 11.35 | 3.38 | 6.09 | 98.72 |

FIG. 12A

USING COSINE SQUARED DISTRIBUTION

1200B →

| AREA | % POWER |
|---|---|
| SLOT 1 | 5.77 |
| WALL | 1.36 |
| SLOT 2 | 41.2 |
| WALL | 3.33 |
| SLOT 3 | 41.2 |
| WALL | 1.36 |
| SLOT 4 | 5.77 |
| TOTAL | 99.99 |

FIG. 12B

GENERIC PICK-UP HORN FOR HIGH POWER THERMAL VACUUM TESTING OF SATELLITE PAYLOADS AT MULTIPLE FREQUENCY BANDS AND AT MULTIPLE POLARIZATIONS

RELATED APPLICATIONS

This application is a continuation-in-part of U.S. application Ser. No. 11/446,974 filed 6 Jun. 2006, which claims the benefit of U.S. Provisional Application Ser. No. 60/758,940 filed 12 Jan. 2006, the contents of both of which are incorporated herein by reference in their entireties; further, this application claims the benefit of U.S. Provisional Application Ser. No. 60/907,476 filed 3 Apr. 2007, the content of which is incorporated herein by reference in its entirety.

FIELD OF THE INVENTION

The present invention generally relates to the testing of satellites and, more particularly, relates to the high-power thermal vacuum testing of satellite payloads at multiple frequency bands and at multiple polarizations.

BACKGROUND OF THE INVENTION

Prior to launch, spacecraft are regularly subjected to thermal vacuum testing to ensure that their payloads function as intended in the vacuum of space. Because the payloads of spacecraft frequently operate at very high power (e.g., radiating antennas operating at 2000 W or more), testing payload operations at full power in a vacuum environment presents a number of challenges. The power radiated from the antennas of the spacecraft must be fully absorbed, without any potentially damaging leakage of power reaching the receive antennas or any other flight hardware.

One approach to absorbing the power radiated by a spacecraft in a thermal vacuum ("TVAC") chamber uses large and expensive absorber boxes that surround the power generating antennas. Because these absorber boxes are so large, they frequently prevent all antennas on a spacecraft from being tested at the same time. Accordingly, the TVAC chamber must be de-pressurized, the absorber boxes moved to different antennas on the spacecraft and the TVAC chamber re-pressurized before testing can continue. This approach is very slow, as the process of de-pressurizing and re-pressurizing the TVAC chamber and testing the spacecraft can take up to two or three months.

Another approach uses waveguides to redirect the power generated by the radiating antennas of a spacecraft outside of the TVAC chamber through radio frequency-transparent ceramic windows. To attach the waveguides, it is necessary to decouple the radiating horn antennas from the spacecraft, which can negatively affect the accuracy of the payload testing. Because waveguides are sensitive to the polarization of radiation, working best with linearly polarized radiation, there may be significant return loss (i.e., reflection of incident radiation) with antennas that emit elliptically polarized radiation. Moreover, the ceramic window through which the waveguide directs the radiation presents a danger of vacuum compromise, which can result in damage to the spacecraft.

Accordingly, there is a need for a way to perform high-power thermal vacuum testing of spacecraft payloads that is less expensive, less time-consuming, and insensitive to polarization, that does not require decoupling horn antennas from the spacecraft, and that can accommodate all of the antennas on the spacecraft in one test set-up.

SUMMARY OF THE INVENTION

The present invention provides systems, methods, and apparatus that utilize one or more pick-up horns for use during high-power thermal vacuum testing ("TVAC") of a spacecraft payload. Such spacecraft payloads can include various RF transmitting antennas operational over various communications bands with various polarizations and utilizing various feed and reflector designs.

As is described in further detail herein, aspects and embodiments of the present invention can accordingly provide for high power TVAC testing of satellite payloads operating over various transmission spectrums or bands including, but not limited to, the X-band, Ku-band, and Ka-band (e.g., operating from 7.0 GHz to 21.0 GHz). Such pick-up horn techniques can be used for receiving, absorbing, and cooling high power from the satellite payloads and flight horns, while allowing complete performance tests of all the payload transponders through their feed horns and thermal validation of the payload simultaneously without breaking the vacuum. Such techniques can further provide good return loss with the flight horns to ensure minimal reflected power back into the horns, while minimizing the RF leakage into the spacecraft.

For such techniques according to the present invention, a pick-up horn is disposed in front of and physically separate from each radiating antenna of the spacecraft payload. Each pick-up horn includes an outer metal wall forming a metal body having one or more chambers, and a front metal face having one or more openings corresponding to the one or more chambers. In each chamber, one or more high-power absorbing loads are disposed. Each pick-up horn further includes a coolant path disposed within the metal body, through which coolant flows, for transferring the heat generated by the high-power absorbing loads to the coolant.

According to an aspect of the present invention, a pick-up horn is provided for absorbing radiation emitted by the flight antenna. The pick-up horn includes at least one outer metal wall forming a metal body and a plurality of interior surfaces disposed in the metal body and forming a plurality of chambers in the metal body. The pick-up horn further includes a plurality of openings corresponding to the plurality of chambers. The plurality of openings can be disposed at one (e.g., front) end of the metal body, such as on a metal surface or side/area of the metal body. A plurality of high-power absorbing loads, e.g., of suitable ceramic material, can be disposed in the plurality of chambers. Each high-power absorbing load is disposed within a corresponding one of the plurality of chambers and affixed to at least one of the plurality of interior surfaces. An adhesive and/or fastener may be used to affix the high-power absorbing load within the corresponding chamber. The pick-up horn can further include a coolant path, e.g., a serpentine path, disposed within the metal body between an outer surface of the at least one outer metal wall and the areas or locations of the plurality of ceramic high-power absorbing loads. The coolant path includes a coolant inlet and a coolant outlet, each of which can be disposed on the outer surface of the at least one outer metal wall. The plurality of openings can be of identical, similar, or differing sizes and shapes.

In accordance with another aspect of the present invention, a system is provided for testing one or more payload antennas of a spacecraft. The system can include one or more pick-up horns having at least one high power absorbing load for absorbing radiated power of an antenna. Included in the system is a plurality of thermal sensors configured and arranged to detect a temperature associated with the at least one high power absorbing load and to monitor associated output temperature values. The system can also include one or more payload antenna feeds configured and arranged to receive RF drive signals and produce radiated RF power as well as one or more frequency synthesizers configured and arranged to produce RF output drive signals to drive the one or more payload antenna feeds. A processor may be present that is configured and arranged to receive the temperature signals from the thermal sensors and to turn off or reduce the output signals of the control the frequency synthesizers to therefore reduce or turn off the radiated RF power of the one or more antenna feeds.

A further aspect of the present invention provides a method of testing one or more spacecraft payload antenna feeds. The method can include configuring one or more pick-up horns of the present invention in proximity to one or more antenna feeds of a spacecraft payload. Each pick-up horn is positioned relative to the corresponding payload antenna to receive the radiated power produced by the antenna feed. Physical contact between each pick-up horn and corresponding antenna feed is avoided. The payload, including payload antenna/antenna feed(s), and the one or more pick-up horns are placed in a thermal vacuum chamber. The one or more antenna feeds of the payload are energized to produce radiated RF power. The radiated RF power is received with the one or more pick-up horns. The temperature of the one or more pick-up horns is monitored. The RF drive signals provide to the one or more antenna feeds are controlled to reduce the radiated power of the antenna feeds in the event the temperature one or more of the pick-up horns exceeds a specified value. The temperature of the payload can be adjusted in the vacuum for thermal testing.

It is to be understood that both the foregoing summary of the invention and the following detailed description are exemplary and explanatory and are intended to provide further explanation of the invention as claimed.

In the following description, reference is made to the accompanying attachments that form a part thereof, and in which are shown by way of illustration specific embodiments in which the invention may be practiced. It is to be understood that other embodiments may be utilized and changes may be made without departing from the scope of the present invention.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention. The drawings are not necessarily to scale, but emphasis is placed on the principles of the disclosure. In the drawings:

FIG. 9 depicts a perspective view of a generic pick-up horn with RF absorbing plate attachments, instead of RF chokes shown in FIGS. 8A & 8B, to minimize leakage outside according to a further embodiment of the present invention;

FIGS. 12A and 12B depict calculated mode and power distributions for a generic pick-up horn similar to the embodiment of FIG. 9;

Figure 1A:
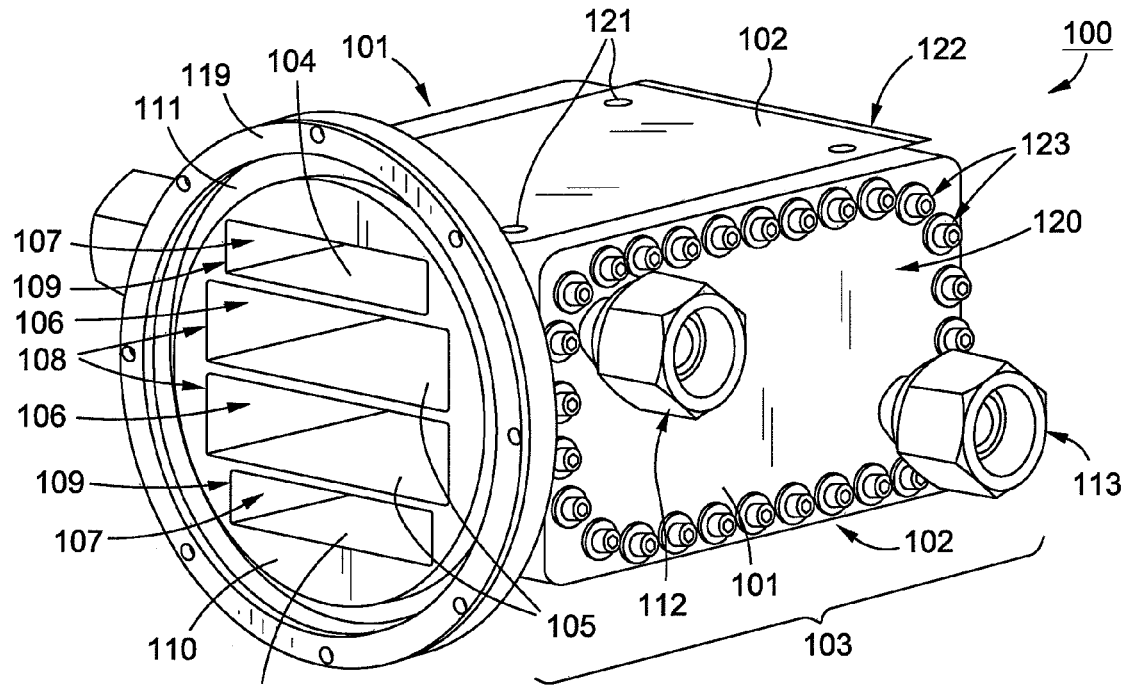
FIGS. 1A to 1D depict various views of a pick-up horn according to one embodiment of the present invention.

While certain embodiments depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown-in detail to avoid unnecessarily obscuring the present invention.

The present invention provides systems, methods, and apparatus that utilize one or more pick-up horns for use during high-power thermal vacuum testing (TVAC) of a spacecraft payload. Such spacecraft payloads can include various transmitting antennas operational over communications bands including those used for satellite to ground communications links. The payload antennas can include those operating in various microwave regimes including, but not limited to, X-band, Ku-band and Ka-band; other frequencies and bands may also be accommodated. The payload antenna can transmit a multiplicity of polarizations simultaneously that include linear polarization with all orientations and/or circular polarizations of both senses (left hand circular and right hand circular polarizations). The payloads can utilize various feed and reflector designs. The reflector designs can include compound reflector designs including various Cassegrain and/or Gregorian forms.

Aspects and embodiments of the present invention can allow for receiving, absorbing, and cooling high power from the satellite payloads and flight horns, while allowing complete performance tests of all the payload transponders through their feed horns and thermal validation of the payload simultaneously without breaking the vacuum. Such techniques can further provide good return loss with the flight horns to ensure minimal reflected power back into the horns, while minimizing the RF leakage into the spacecraft and/or testing environment.

FIGS. 1A to 1D depict a pick-up horn 100 according to one embodiment of the present invention. Pick-up horn 100 includes outer metal walls, such as side walls 101, top and bottom walls 102 and RF shorting back plate 122, which form a metal body 103. Pick-up horn 100 further includes interior surfaces 104 and 105, which form inner chambers 106 and outer chambers 107 in metal body 103. At a front end of metal body 103 is disposed a front metal surface 110 with rectangular openings 108 and 109 corresponding to chambers 106 and 107. Within each chamber 106 and 107 is disposed one or more wedge-shaped high-power absorbing loads 114 and 115, each of which is in contact with one of the interior surfaces (e.g., 104 and 105, respectively). Grooves 116 are provided between the high-power absorbing loads and the interior surfaces, to receive thermocouples 117 for monitoring the temperature of pick-up horn 100. Vent holes 121 provide a path between outer metal wall 102 and the chambers for the escape of gas released by the high-power absorbing loads 114 and 115, or by any other component, during testing high-power TVAC testing.

According to one embodiment, outer metal walls 101, 102 and 122 are assembled to provide a vacuum seal using stainless steel cover screws 123 and a knife edge and Sn96 solder. While in the present exemplary embodiment, metal body 103 is shown as a box shape being formed by five outer metal walls, the scope of the present invention is not limited to such an arrangement. Rather, the present invention may include any number of outer metal walls, including one (e.g., a conical wall), which form a metal body of any shape.

According to one embodiment, high-power absorbing loads 114 and 115 are space-qualified ceramic high-power absorbing loads with power absorption of about 30 dB/inch such as, for example, RS-4200 CHP™ (a formulation of silicon carbide). Each high-power absorbing load 114 and 115 is bonded to corresponding interior surface 104 and 105 with a thin (e.g., 0.005" thick) layer of thermally conductive bonding epoxy such as, for example, CV2646 or other suitable RTV adhesive. The bonding epoxy can be applied with high pressure to improve the thermal conduction between the high-power absorbing loads 114 and 115 and the interior surfaces 104 and 105. According to one embodiment, high-power absorbing loads 114 and 115 are further secured to interior surfaces 104 and 105 with fasteners, such as, for example, screws, to insure against failure of the bonding epoxy.

While the present exemplary embodiment has been described as including RS-4200 CHP ceramic high-power absorbing loads, the scope of the present invention is not limited to such an arrangement. As will be apparent to one of skill in the art, any one of a number of high-power absorbing loads may be used. In an embodiment of the present invention intended for TVAC testing, the high-power absorbing loads used should have low outgassing properties.

While the present exemplary embodiment has been described as including thermally conductive bonding epoxy CV2646, the scope of the present invention is not limited to such an arrangement. As will be apparent to one of skill in the art, any one of a number of thermally conductive bonding epoxies may be used within the scope of the present invention. For example, any of a number of silver-filled silicone adhesives known to those of skill in the art may be used. In an embodiment of the present invention intended for TVAC testing, the thermally conductive bonding epoxy used should have low outgassing properties.

The heat generated by high-power absorbing loads 114 and 115 as they absorb radiation is removed from pick-up horn 100 by a cooling system. Coolant flows through metal body 103, entering at coolant inlet 112 on outer metal wall 101, passing through serpentine coolant path 120 between outer metal wall 101 and chambers 106 and 107, and exiting through coolant outlet 113 on outer metal wall 101. Vacuum chambers are routinely provided with liquid or gaseous nitrogen cooling systems, to which pick-up horn 100 may be connected. As will be apparent to one of skill in the art, however, pick-up horn 100 may employ any one of a number of coolants for removing heat from high-power absorbing loads 114 and 115.

In exemplary embodiments, liquid nitrogen, liquid helium, or Fluorinert® can be used as a coolant for PUH 100. Fluorinert® is the trademarked brand name for the line of electronics coolant liquids sold commercially by 3M Company. It is an electrically insulating, inert perfluorocarbon fluid which is used in various cooling applications but is mainly for cooling electronics. Different molecular formulations are available with a variety of boiling points, allowing it to be used in "single phase" applications where it remains a fluid, or for "two-phase" applications where the liquid boils to remove additional heat via evaporative cooling. An example of one of the formulations 3M uses would be for instance, FC-72, or perfluorohexane ($C_6F_{14}$) which is used for low temperature heat transfer applications due to its boiling point of 56° C. Another example is FC-75, perfluoro(2-butyl-tetrahydrofurane).

Continuing with the description of FIG. 1, thermal sensors or thermocouples 117 allow for temperature monitoring of pick-up horn 100, particularly along the thermal interface between the high-power absorbing loads and their respective interior surfaces. According to one embodiment, thermocouples 117 are coupled to a monitoring system which sounds an audible alarm and/or discontinues the high-power testing should any of thermocouples 117 indicate a temperature higher than a predetermined temperature limit.

When pick-up horn 100 is disposed in front of a radiating antenna, the radiation emitted thereby enters chambers 106 and 107 through respective openings 108 and 109. The openings are "oversized" in that they are insensitive to the polarization of radiation emitted by the radiating antenna. Moreover, the size of the openings allows pick-up horn 100 to absorb not only the radiation emitted by the radiating antenna in the dominant mode, but in higher-order modes as well. Finally, the size of the openings allows pick-up horn 100 to be substantially RF-transparent (e.g., about 99% transparent) to the radiating antenna.

The central region of a wavefront emitted by a radiating antenna typically has a higher amplitude than the outer regions. Accordingly, the openings nearer the center of front metal surface 110, such as opening 108, are larger than those farther away, such as opening 109, so that these central openings can accommodate the larger amount of energy radiated in this region of the wavefront. According to one embodiment, a pick-up horn of the present invention includes odd number of chambers and openings, such that the area of the central opening includes the geometric center of the radiated wavefront. In this manner, the surface area of the front metal surface is minimized in this region of high amplitude radiation, to reduce undesirable return loss (e.g., the reflection of radiation back to the radiating antenna).

According to one embodiment, the metal used for outer metal walls 101 and 102 is stainless steel. Alternatively, any one of a number of other metals, such as copper, aluminum, and the like may be used. According to one embodiment, front metal surface 110 is composed of a different metal than outer metal walls 101 and 102. For example, front metal surface 110 may be made of copper (Cu), while outer metal walls 101 and 102 are made of stainless steel. While the present exemplary embodiments have been described with reference to particular metals, it will be apparent to one of skill in the art that the present invention has application to a wide range of metals, and is not limited to the use of those listed herein.

A radio frequency ("RF") choke 111, in the form of an annular groove, can located around an outer region of front metal surface 110. The RF choke minimizes RF leakage from pick-up horn 100. In one exemplary experimental embodiment, discussed more fully below with reference to FIG. 7, the RF choke allowed less than 0.01% of the total input power applied to a pick-up horn of the present invention to leak into the test chamber.

Figure 1B:
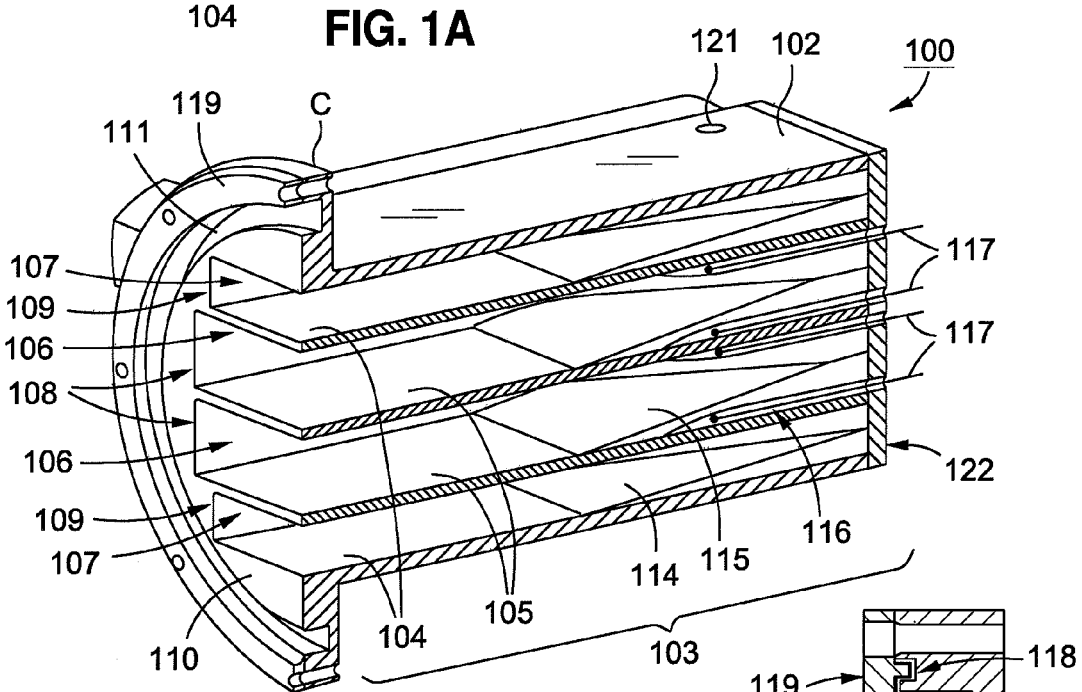
Figure 1C:
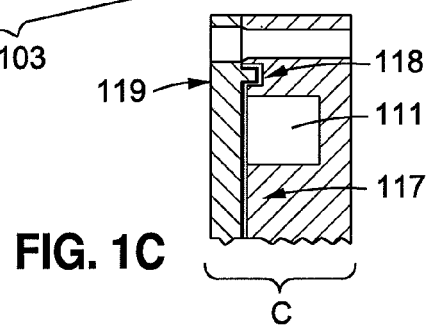
Figure 1D:
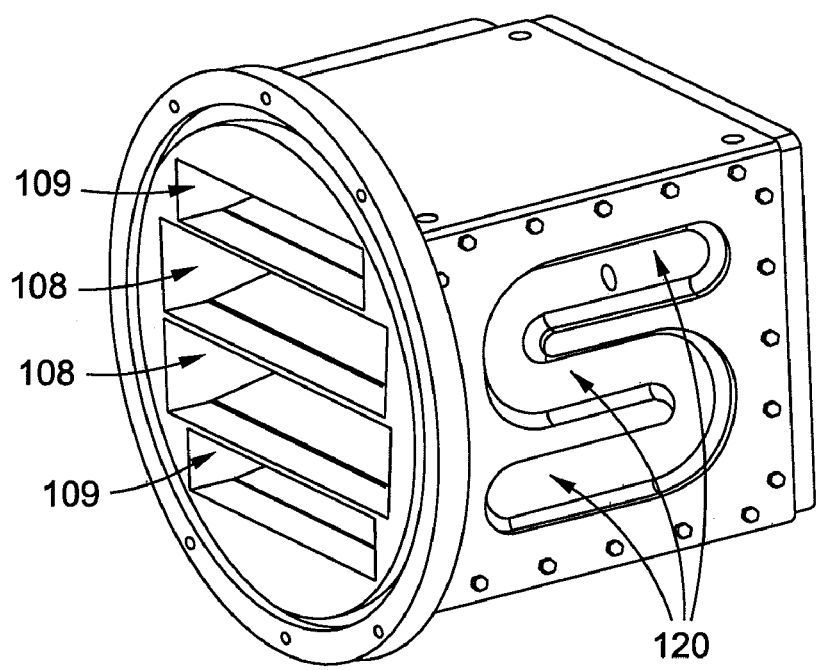

As can be seen with reference to FIG. 1C, which provides a more detailed view of region C in FIG. 1B, an RF-transparent debris shield 117 is located over front metal surface 110, and is held in place by a clamp ring 119 disposed into clamp groove 118. Debris shield 117 covers front metal surface 110 and openings 108 and 109 to protect the sensitive and expensive antenna in front of which pick-up horn 100 is disposed from being damaged in the event that any debris is knocked loose from pick-up horn 100 during testing. According to one embodiment, debris shield 117 is a polyimide film such as Kapton®. Alternatively, debris shield 117 may be any material which is substantially RF-transparent and capable of withstanding high power radiation. FIG. 1D depicts a perspective view of pick-up horn 100 with side wall 101 removed, showing the underlying surface with serpentine channel 120.

The dimensions of pick-up horn 100 are significantly smaller than the dimensions of an absorber box designed for use with a similar transmit antenna. According to one embodiment applicable for use with a Ku-band transmit antenna, pick-up horn 100 is about 5" tall by 5" wide by 6" long. The scope of the present invention is not limited to pick-up horns with the dimensions of this exemplary embodiment, of course, but rather covers pick-up horns of any size.

Figure 2:
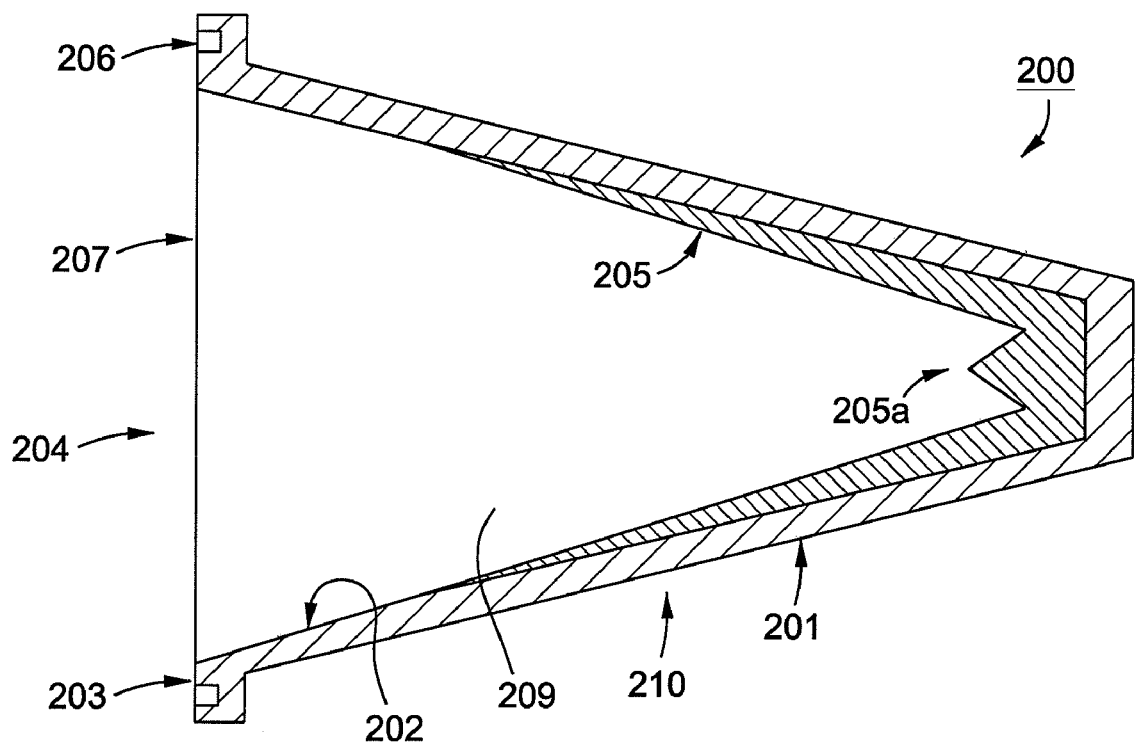
FIG. 2 depicts a partial cut-away view of a pick-up horn according to another embodiment of the present invention.

Referring to FIG. 2, a pick-up horn 200 according to another embodiment of the present invention is illustrated in a partial cut-away view. Pick-up horn 200 includes an outer metal wall 201 forming a conical metal body 210. An interior surface 202 within metal body 210 forms a single chamber 209, which has a corresponding circular (e.g., elliptical) opening 204 in a front metal surface 203 of metal body 210. An RF-transparent debris shield 207 is disposed over front metal surface 203. Surrounding opening 204, an RF choke 206 is formed in the shape of an annular groove in front metal surface 203. Within chamber 209 is disposed a high-power absorbing load 205 with a substantially conical shape. High-power absorbing load 205 includes a raised conical central region 205a which projects back towards opening 204.

Figure 3A:
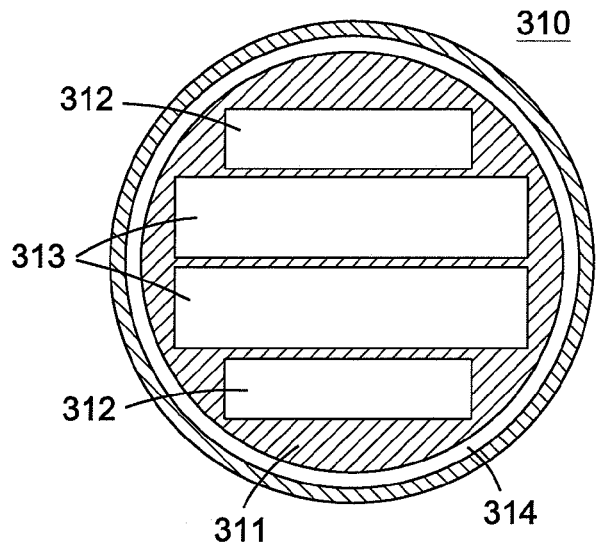
FIGS. 3A to 3C depict frontal views of pick-up horns according to various embodiments of the present invention.
Figure 3B:
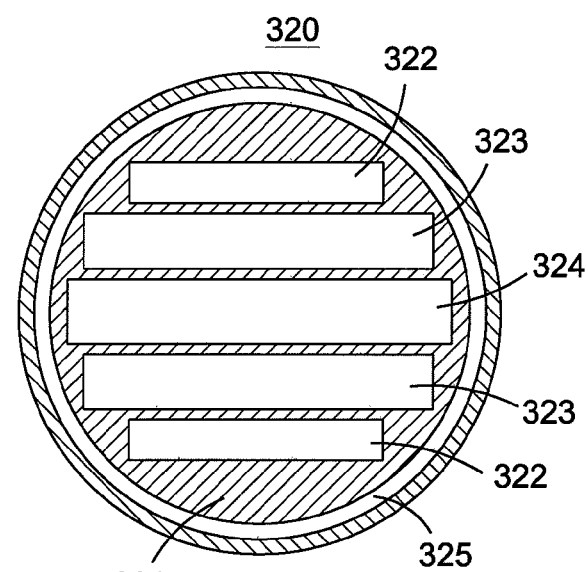
Figure 3C:
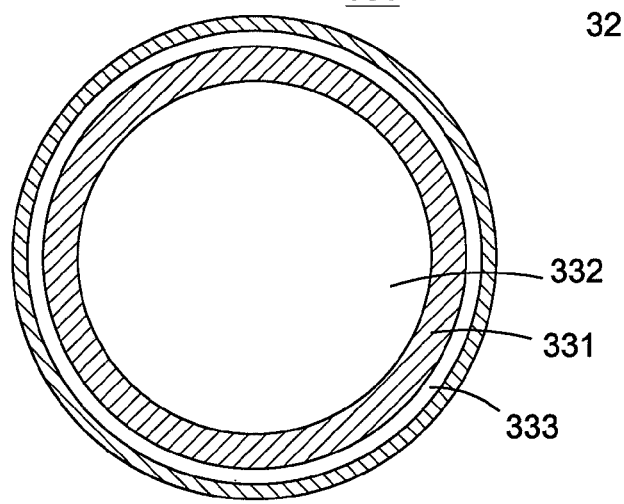

Turning to FIGS. 3A-3C, frontal views of a number of pick-up horns are illustrated, according to various embodiments of the present invention. In FIG. 3A, pick-up horn 310 includes a front metal surface 311, in which rectangular openings 312 and 313 are disposed. Openings 313, being closer to a center of front metal surface 311, are larger in width and breadth than openings 312, which are farther from the center. An RF choke 314 in the form of an annular groove is disposed around an outer region of front metal surface 311.

Pick-up horn 320, illustrated in FIG. 3B, includes a front metal surface 321 with an odd number of rectangular openings 322, 323 and 324. Opening 324, which is located in the center of front metal surface 321, is positioned to absorb the geometric center of a radiated wavefront. Accordingly, opening 324 is larger than more radially distant openings 323 and 322, in order to accommodate the higher amplitude radiation in this region of the wavefront. An RF choke 325 in the form of an annular groove is disposed around an outer region of front metal surface 321.

Pick-up horn 330, illustrated in FIG. 3C, includes a front metal surface 331 with a single elliptical (e.g., circular) opening 332. In this arrangement, the area of front metal surface 331 is minimized, to reduce the return loss (e.g., reflection of part of a radiated signal) of pick-up horn 330. An RF choke 333 in the form of an annular groove is disposed around an outer region of front metal surface 331.

While the present exemplary embodiments have illustrated pick-up horns with particular arrangements of rectangular or elliptical openings, the scope of the present invention is not limited to these arrangements. Rather, as will be apparent to one of skill in the art, a pick-up horn with any number of openings of any shape and size may be used to absorb radiation emitted by a transmit antenna within the scope of the present invention.

Figure 4:
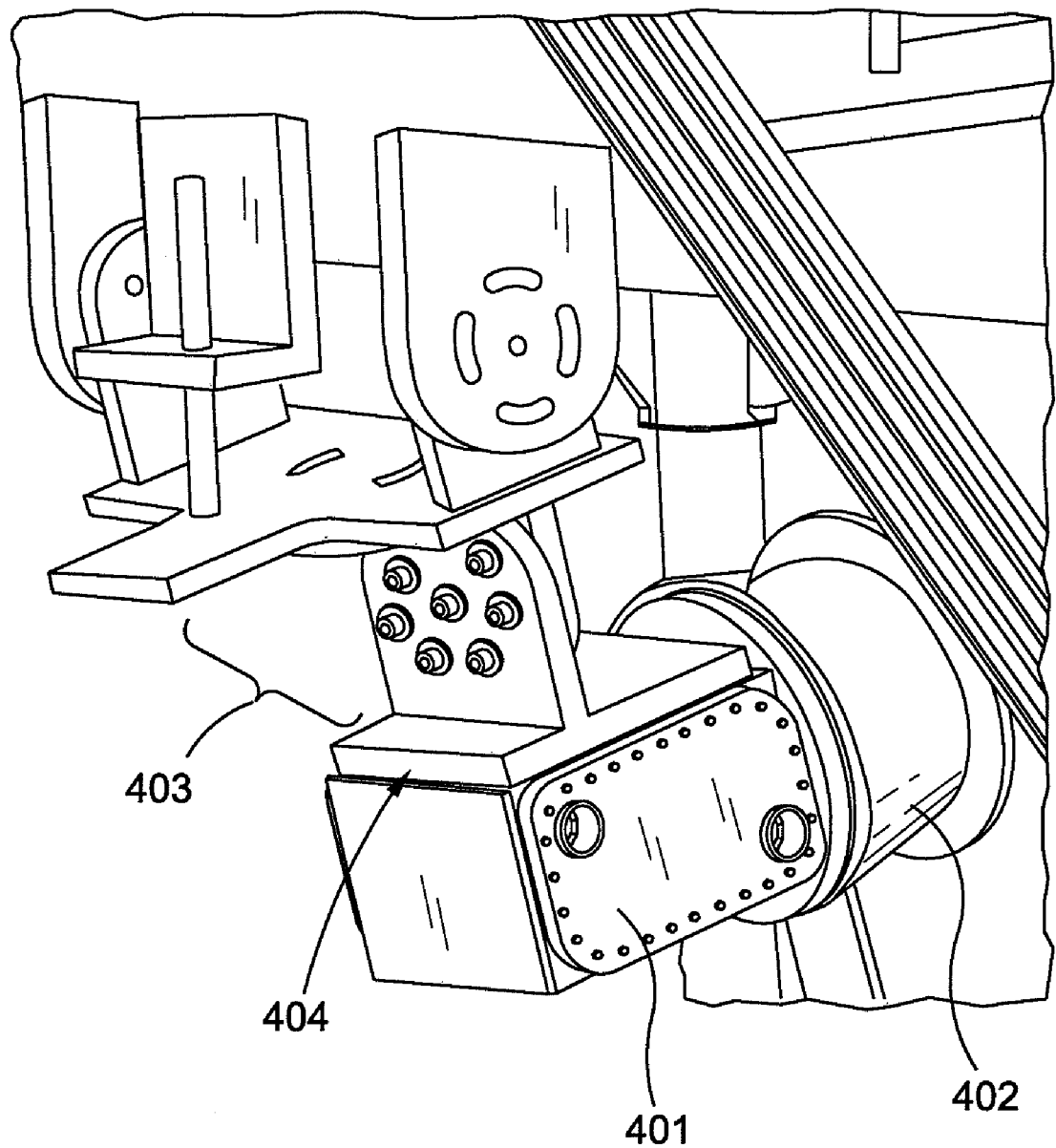
FIG. 4 depicts a pick-up horn disposed in front of a transmit antenna according to one embodiment of the present invention.

Referring to FIG. 4, the arrangement of a pick-up horn 401 for testing a transmit antenna 402 is illustrated according to one embodiment of the present invention. Pick-up horn 401 is connected to pivot mechanism 403 with non-conductive bracket 404. Pivot mechanism 403 provides 360.degree. of freedom in order to facilitate the alignment of pick-up horn 401 with transmit antenna 402 which is disposed on a satellite (not illustrated). Pick-up horn 401 is disposed in front of (e.g., about 0.2" from) transmit antenna 402. No contact between pick-up horn 401 and transmit antenna 402 is needed for pick-up horn 401 to absorb the radiation emitted by transmit antenna 402. Accordingly, transmit antenna 402 is protected from any damage that could be caused by physically mating transmit antenna 402 with other radiation absorbing systems.

Figure 5:
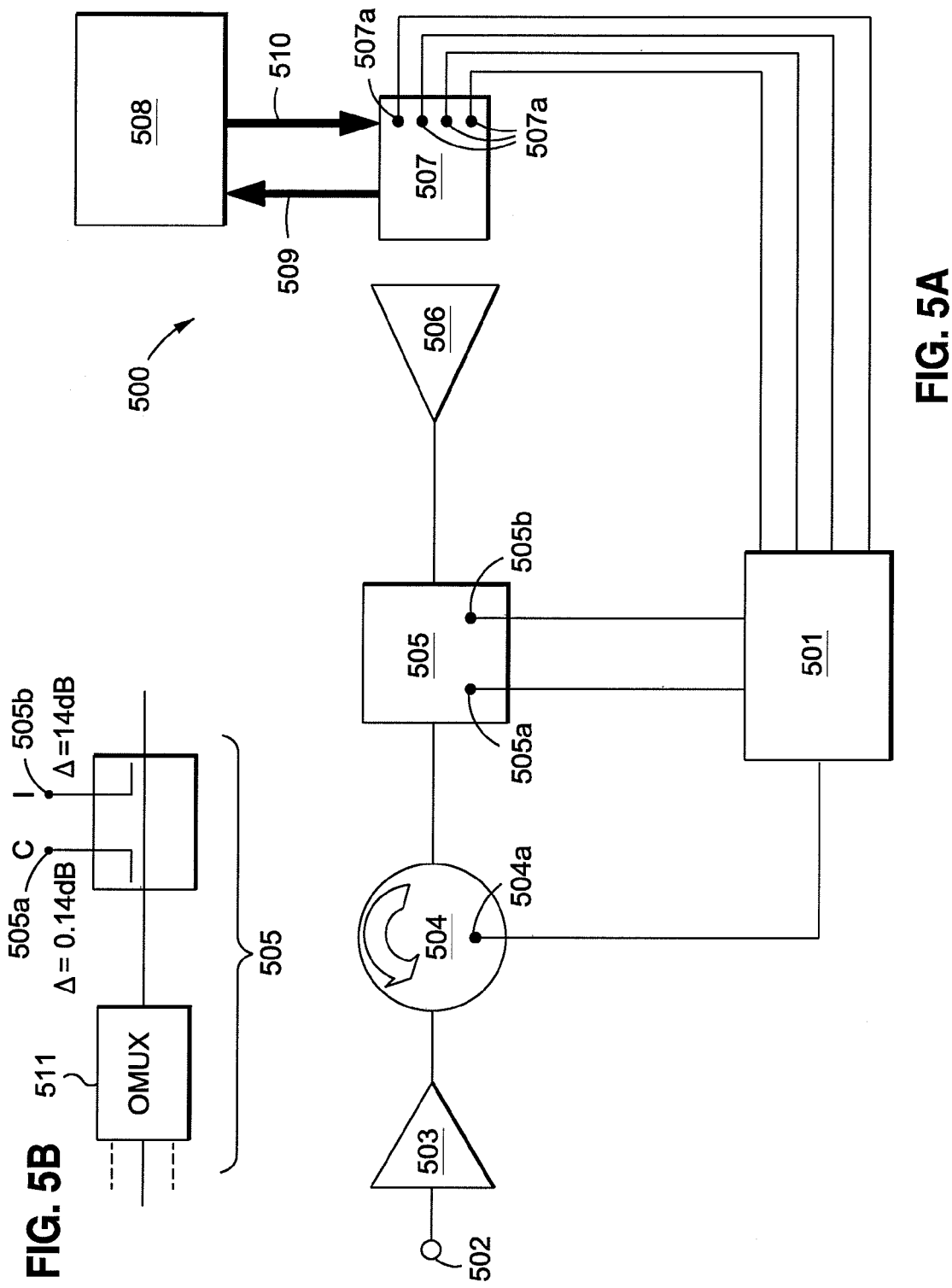
FIGS. 5A-5B depict block diagrams of a pick-up horn arranged in a test configuration.

FIGS. 5A-5B FIGS. 5A-5B depict block diagrams of a pick-up horn arranged in a test configuration 500. Referring to FIG. 5, a pick-up horn arranged in a test configuration according to one embodiment of the present invention is depicted. An input signal 502 is applied to an amplifier 503, which amplifies the signal and supplies it to horn antenna 506. Between amplifier 503 and horn antenna 506 is disposed a circulator load 504, which absorbs any power reflected back to amplifier 503 from horn antenna 506. A thermal monitor 504a is disposed on circulator load 504 and is connected to monitoring system 501. Also disposed between amplifier 503 and horn antenna 506 is a test coupler site 505, to which a coupled port 505a and an isolated port 505b are connected. Test coupler site 505 can be used for power monitoring and payload testing during HP TVAC testing.

Coupled port 505a is sensitive to power being supplied from amplifier 503 to horn antenna 506 ("forward power"), while isolated port 505b is sensitive to power reflected from horn antenna 506 back to amplifier 503 ("reflected power").

ratio between the forward and reflected powers (after calibration for the directivity of the coupler, cables/lines, and connectors) gives the channel return loss, while the measured phase response of the channel with frequency gives the group delay. Both coupled port 505a and isolated port 505b are connected to monitoring system 501. Pick-up horn 507 is disposed in front of horn antenna 506 to absorb the radiation emitted by horn antenna 506, as is described in greater detail above. Pick up horn includes a number of thermocouples 507a, which are connected to monitoring system 501 to monitor the temperature of pick-up horn 507.

Pick-up horn 507 is also connected to cooling system 508, which circulates coolant through pick-up horn 507 by input line 510 and output line 509 to remove the heat generated during HP TVAC testing. Cooling system operates 508 to maintain the coolant at a predetermined temperature. For example, according to one embodiment of the present invention, cooling system 508 is programmed to maintain a liquid nitrogen coolant at −100 C.

Continuing with the description of FIG. 5A, Monitoring system 501 functions (e.g., is programmed) to monitor the temperature of pick-up horn 507 and circulator load 504, as well as the power supplied to horn antenna 506 and reflected there from to amplifier 503, to ensure that all values remain within predetermined safety parameters. In the event that one or more of these values exceeds a predetermined safety parameter, monitoring system 501 can provide an alarm signal such as an audible alarm, and/or discontinue the testing of the flight horn (e.g., by cutting off input signal at 502).

FIG. 5B depicts an exemplary embodiment of test coupler site 505, or dual-directional test coupler, such used for testing of multiple antenna feeds with multiple pick-up horns. Test coupler site 505 can include an output multiplexer ("OMUX") 511 that is configured to receive multiple inputs, e.g., from one or more circulators 504 or one or more frequency synthesizers (e.g., shown in FIG. 11). Coupled port 505a and isolated port 505b are shown with representative sensitivities.

Figure 6:
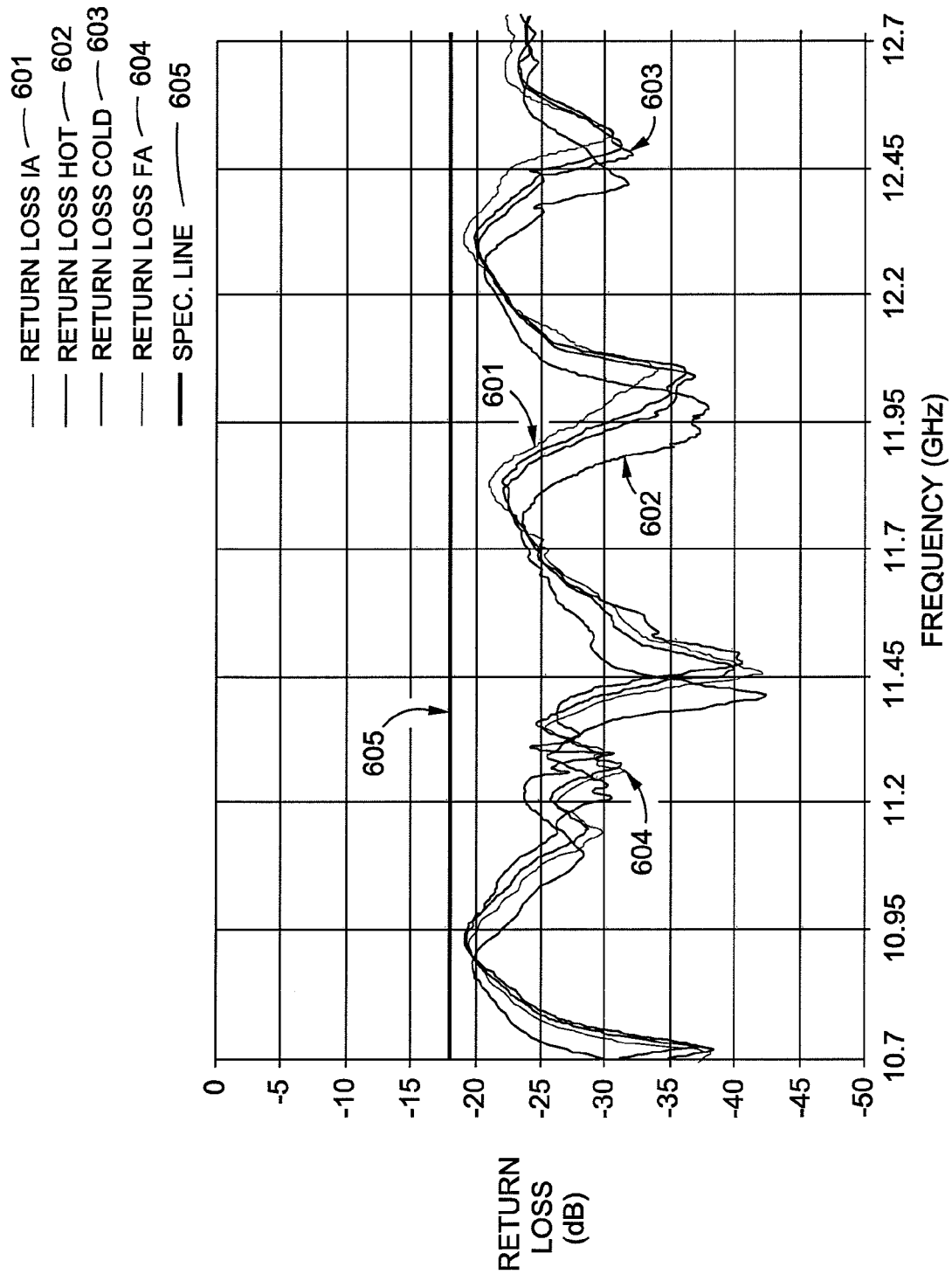
FIG. 6 is a graph illustrating the low return loss experienced by a flight horn when tested by a pick-up horn according to one embodiment of the present invention.

Referring to FIG. 6, the return loss (in dB) experienced by a flight horn when tested by a pick-up horn according to one embodiment of the present invention is charted at various frequencies during thermal cycling. For each of an initial ambient temperature test 601, a high temperature (i.e., 200.degree. C.) test 602, a low temperature (i.e., −70.degree. C.) test 603, and a final ambient temperature test 604, the return loss experienced by the pick-up horn when absorbing 2300 W of power in a vacuum is less than the specified −18 dB (e.g., spec line 605).

Figure 7:
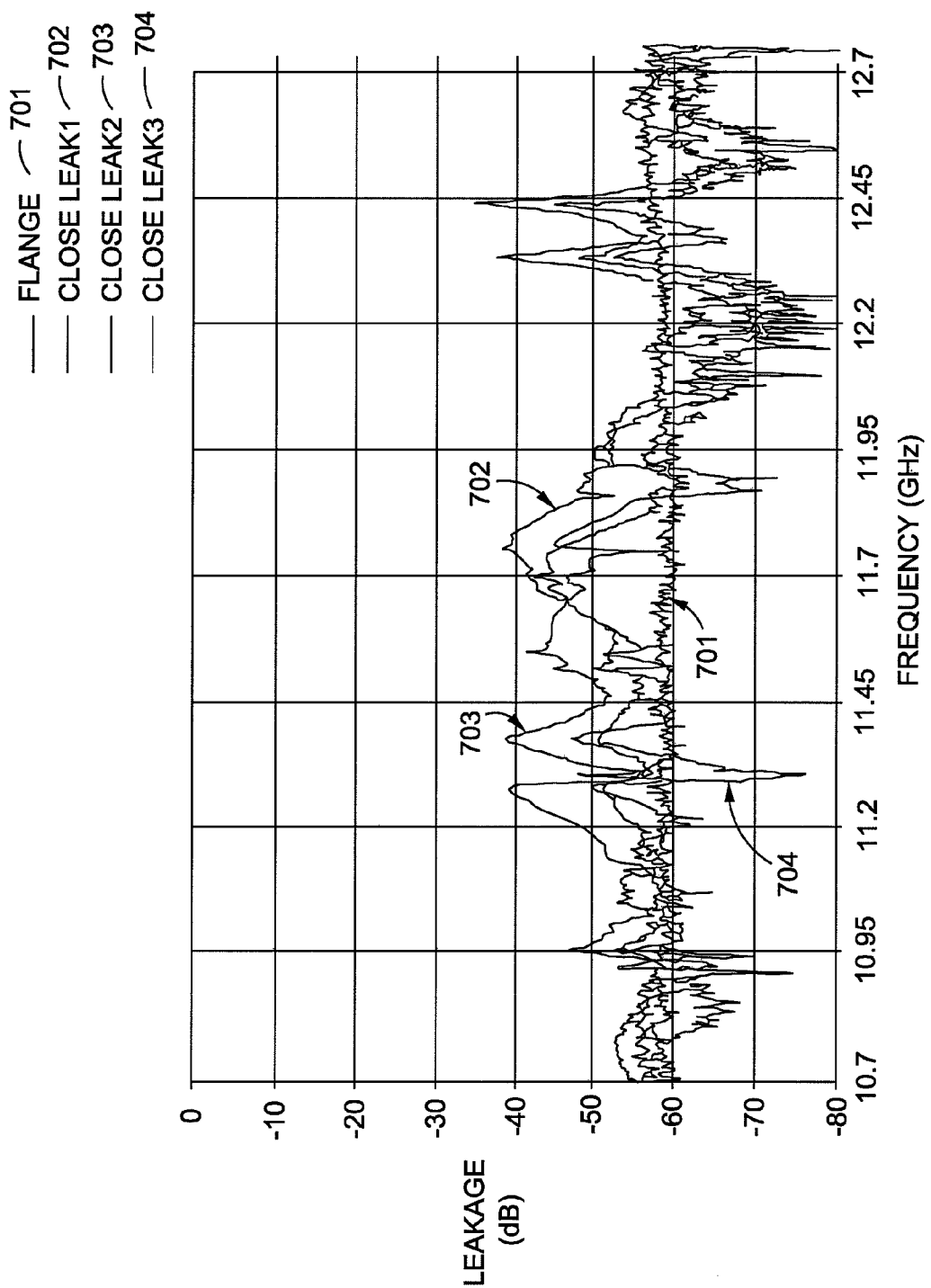
FIG. 7 is a graph illustrating the low leakage experienced by a flight horn when tested by a pick-up horn according to one embodiment of the present invention.

Referring to FIG. 7, the leakage (in dB) experienced by a flight horn radiating 2300 W in a vacuum when tested by a pick-up horn according to one embodiment of the present invention is charted at various frequencies and at various positions with respect to the pick-up horn. The leak measurements were taken with a directive WR75 open-ended waveguide as a probe without about 8.0 dBi directive gain. Flange measurement 701 was taken at the interface between the probe and the antenna under test. The "Close Leak 1" measurement 702 was taken at the junction of the pick-up horn and the probe when the probe was oriented at 0.degree. (i.e., in line with the E-Field). The "Close Leak 2" measurement 703 was taken at the junction of the pick-up horn and the probe when the probe was oriented at 45.degree. The "Close Leak 3" measurement 704 was taken at the junction of the pick-up horn and the probe when the probe was oriented at 90.degree. As can be seen with reference to FIG. 7, the leakage experienced by the pick-up horn is below −50 dB (i.e., less than 0.01% of total input power) over a broad range of wavelengths (the measured leakage is about 8 dB lower than the values shown in FIG. 7, as a result of the 8 dBi directive gain of the probe).

Figure 8A:
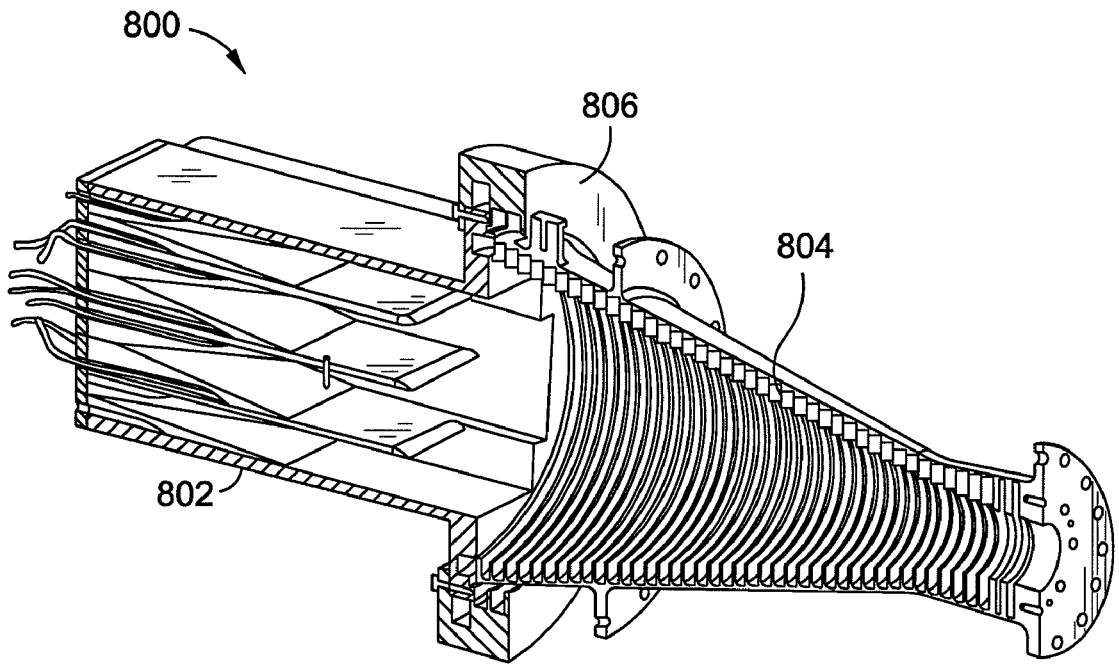
FIGS. 8A and 8B depict section and perspective views of the pick-up horn of FIG. 1 coupled to a flight horn by an RF choke.
Figure 8B:
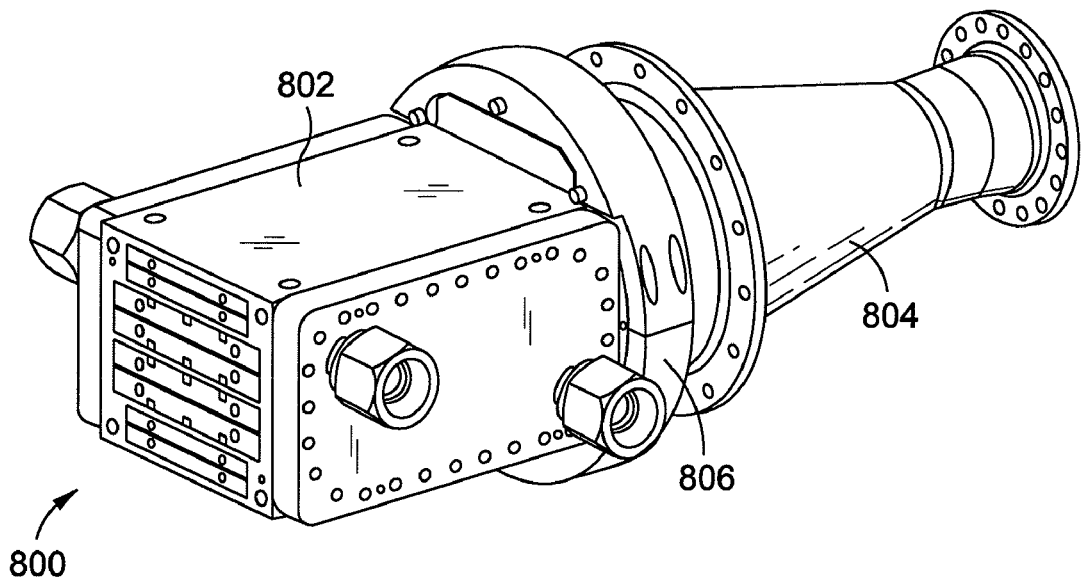

FIGS. 8A and 8B depict section and perspective views of an embodiment 800 of a pick-up horn (PUH) 802, similar to pick-up horn 100 of FIG. 1, coupled to a flight horn 804 by an RF choke 806. The PUH 802 can be aligned with the flight horn 804 using dielectric Teflon ring that has a thickness of 0.100 in. equal to the optimized spacing between the horns. The Teflon spacer ring can first be placed on the PUH 802 and its internal diameter matches the horn 802 outer diameter to allow accurate positioning and alignment. The Teflon ring is removed after the alignment is completed. A detachable choke-ring 806 is then attached around the PUH flange. The purpose of the choke ring is to minimize the RF leakage going into the TVAC chamber and sensitive parts of the payload. The choke-ring 806 can serve to suppress the leakage by an additional 10 dB.

FIG. 9 depicts a perspective view of an exemplary embodiment of a pick-up horn 900 of the present invention. Such a pick-up horn may be referred to herein as a generic pick-up horn ("GPUH"). Such a pick-up horn 900 can have a two or more like-sized openings that are over-moded and support TE10, TE30, TE1 1, and TM1 1 modes. GPUH can exhibit polarization independence when testing payload antennas, so that such generic pick-ups can be used for flight horns having VP, HP, LHCP, RHCP, or any other arbitrary polarization with minimal reflections (e.g., return loss better than 20 dB for any polarization). As for pick-up 100 of FIG. 1, GPUH 900 is RF transparent to flight horns, in order to permit testing of payload channel performance.

Embodiments of GPUH 900 can provide the following: (a) wider bandwidth capability for test of X-band, Ku-band, and Ka-band satellites; (b) insensitivity to polarization, allowing use for vertical, horizontal, linear polarization with arbitrary orientation, left hand circular, and right hand circular polarizations; and, (c) larger electrical size, allowing use for all satellite horns that are employed as feeds for both single reflectors and Gregorian reflectors that produce contoured beams through surface shaping of the reflector(s); in addition, the larger size of the GPUH 900 will have higher power handling capability for test of future satellite payloads; (d) improved return loss due to use of small load caps covering the exposed metallic walls that separate the various chambers as shown in FIG. 9, and (e) improved RF absorbing plates that cover the gap between the GPUH and the flight horn to minimize the RF leakage.

Pick-up horn 900 includes outer metal walls, such as side walls 901, top and bottom walls 902 and RF shorting back plate 922, which form a metal body 903. Pick-up horn 900 further includes interior surfaces, shown by 904, which form chambers 906 in metal body 903. At one end (e.g., a front) of metal body 903 is disposed a front metal surface (shown by 910) with rectangular openings corresponding to chambers 906.

Within each chamber 906 is disposed one or more wedge-shaped high-power absorbing loads 914, each of which is in contact with or affixed to one of the interior surfaces 904. Grooves (not shown) may be present between the high-power absorbing loads 914 and the interior surfaces 904, to receive thermocouples 917 for monitoring the temperature of pick-up horn 900, similar to thermocouples 117 of FIG. 1. Vent holes 921 provide a path between outer metal wall 902 and the chambers 906 for the escape of gas released by the high-power absorbing loads 914 during testing high-power TVAC testing. Two coolant compartments on the two side walls 901 (e.g., made of copper) of the GPUH 900 can be sealed to the body 903 by suitable techniques. For example, side walls 901 can be knife-edge sealed without soldering by using high torque screws, e.g., 923, with bevel washers, in order to ensure that no coolant is leaked from the GPUH 900.

Loads 928 may be present in order to improve the return loss and also facilitate the GPUH 900 being less sensitive to polarization and alignment. Absorber loads 932, e.g., configured as thin strips, may be present on the thin metallic separation walls between adjacent openings 908. Such loads 932 can facilitate improved return loss and insensitivity of the GPUH 900 to polarization and alignment.

Figure 13:
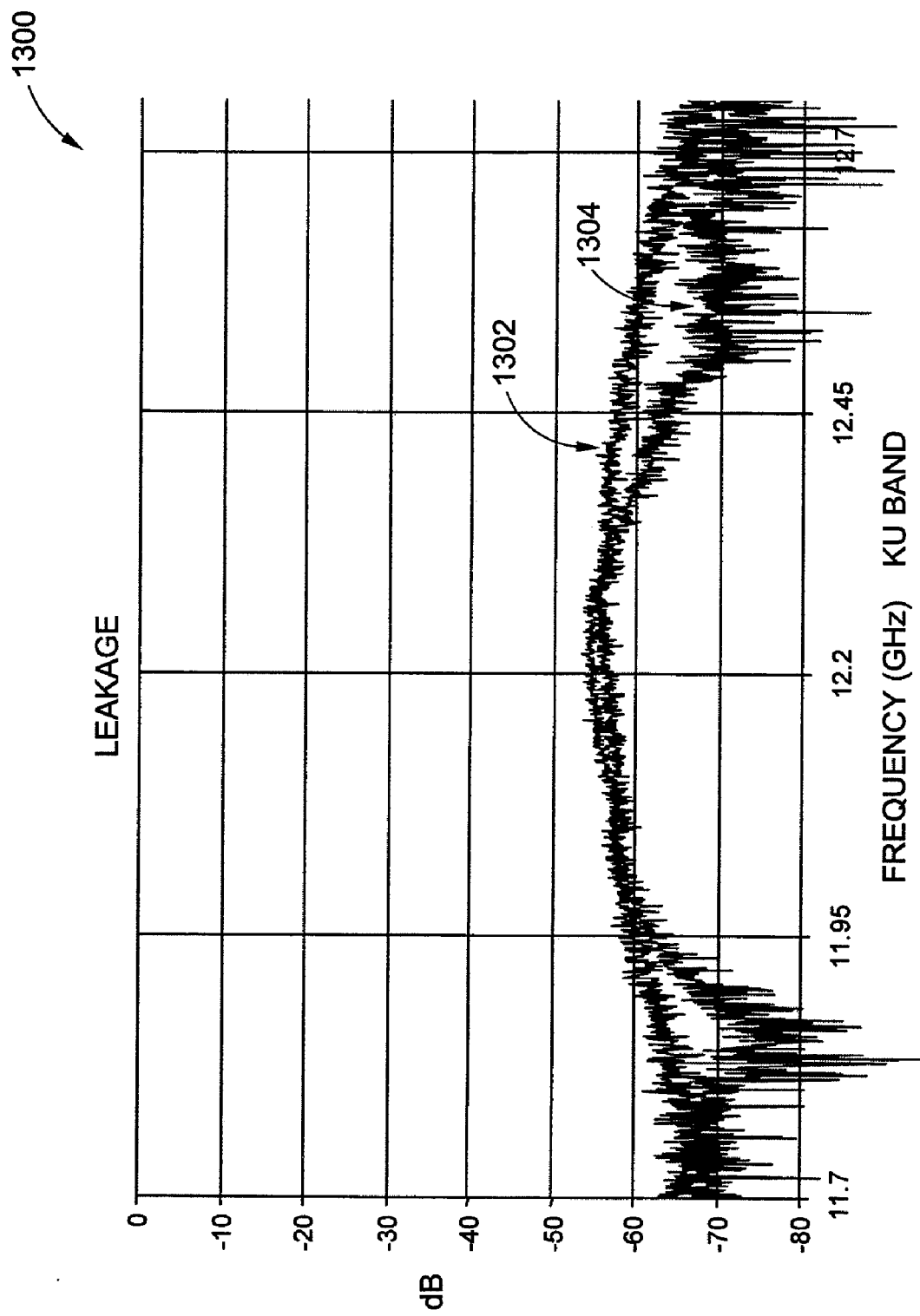
FIG. 13 shows a graph of measured RF leakage at two worst case locations of the generic pick-up horn of FIG. 9 coupled to a flight horn.

A square shroud 915 with ceramic loads, e.g., 930, may be included to cover the gap between the GPUH 900 and the flight horn under test. Typically such a gap would be between 0.050" and 0.100" (50 to 100 mils). Use of the shroud and loads can reduce RF leakage into the TVAC chamber. For an embodiment of GPUH 900 tested and constructed for a Sirius 4 satellite, the leakage measured at two worst case locations was reduced to −55 dBc by incorporating a shroud 915 and loads 930, as indicated in FIG. 13.

As described previously, the large size of GPUH 900 (e.g., relative to pick-up horn 100) can facilitate TVAC testing for almost any flight horn used to illuminate single reflectors or dual-reflector Gregorian antennas. Embodiments of the GPUH 900 can have a very large bandwidth ratio of 3:1, which can cover, e.g., X-band, Ku-band, and Ka-band satellite payloads operating over the 7.0 GHz to 22 GHz range. This can be facilitated by (a) inclusion of a large square aperture, thereby avoiding reflections from side-walls, and by providing smaller absorbing loads (e.g., 932) to cover the thin metallic wall separations of the slots. As a result, measurements of one embodiment of GPUH 900 have shown that about 99.6% of the payload power (e.g., from an/the antenna under test, or "AUT") can be absorbed by the loads of the GPUH with only 0.4% of the power reflected back into the flight horn (AUT).

Embodiments of GPUH 900 can be used for high power testing of any payload components, such as polarizers, ortho-mode transducers ("OMTs"), horns, etc. In an exemplary embodiment, such a GPUH 900 was constructed to have a volume of approximately 7.6 in.×7.6 in.×7 in. with a weight of about 40 lbs. The corresponding front end (with openings 908) is greater than 7 wavelengths×7 wavelengths at Ku-band. In this embodiment, eight thermo-couples (two per slotted region) were used to monitor temperature during TVAC test of a spacecraft payload (a Sirius 4 satellite payload).

Figure 10A:
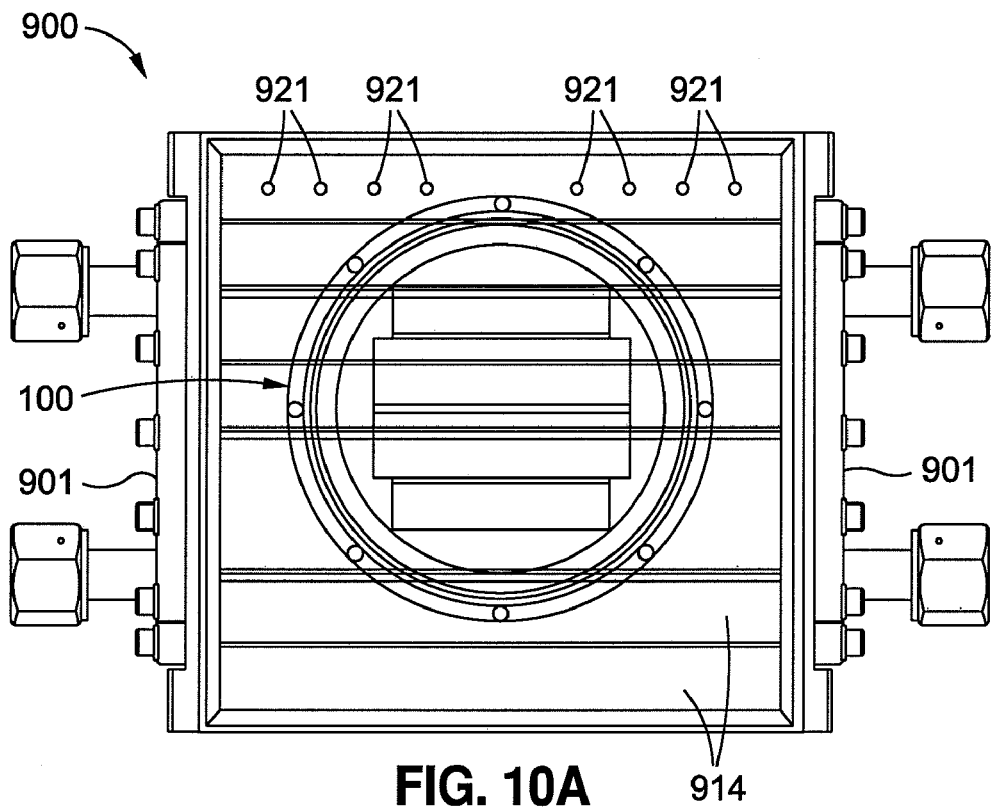
FIGS. 10A and 10B depicts front and perspective views of the generic pickup horn of FIG. 9.
Figure 10B:
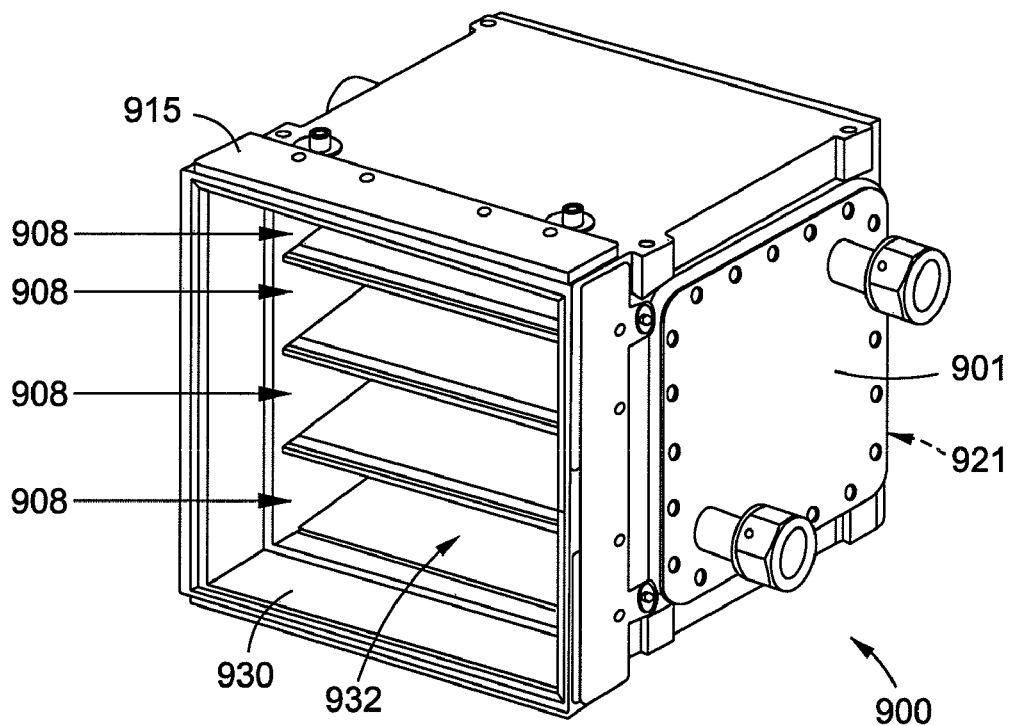

FIGS. 10A and 10B depict front and perspective views of the generic pickup horn (GPUH) 900 of FIG. 9. The geometry of the GPUH 900 is shown in FIG. 10B and the size comparison of the GPUH 900 relative to an exemplary embodiment of pick-up horn 100 of FIG. 1 is illustrated in FIG. 10A by outline 100.

As can be seen in FIG. 10A, GPUH 900 can be much larger than the pick-up horn 100. In an exemplary embodiment, GPUH 900 was constructed to have a square opening (within side 910) of about 7 in.×7 in. The aperture area afforded the GPUH was approximately 250% that of the pick-up horn exemplary embodiment described for FIG. 1, allowing for greater power absorption—or equivalently, allowing for TVAC testing of higher power payload antennas. FIG. 10A also shows examples of vent holes 921 in phantom. Position of vent holes 921 on the side opposite the openings 908 is indicated in FIG. 10B.

With continued reference to FIG. 10A, the large size of GPUH 900 allows it to be used for testing of both single reflector feed horns (typically 4.5 wavelengths diameter) and horns feeding dual-reflector, e.g., Gregorian antennas (typically 6 wavelengths diameter). In an exemplary embodiment, 32 vent holes were provided for increased out-gassing performance in vacuum.

Figure 11:
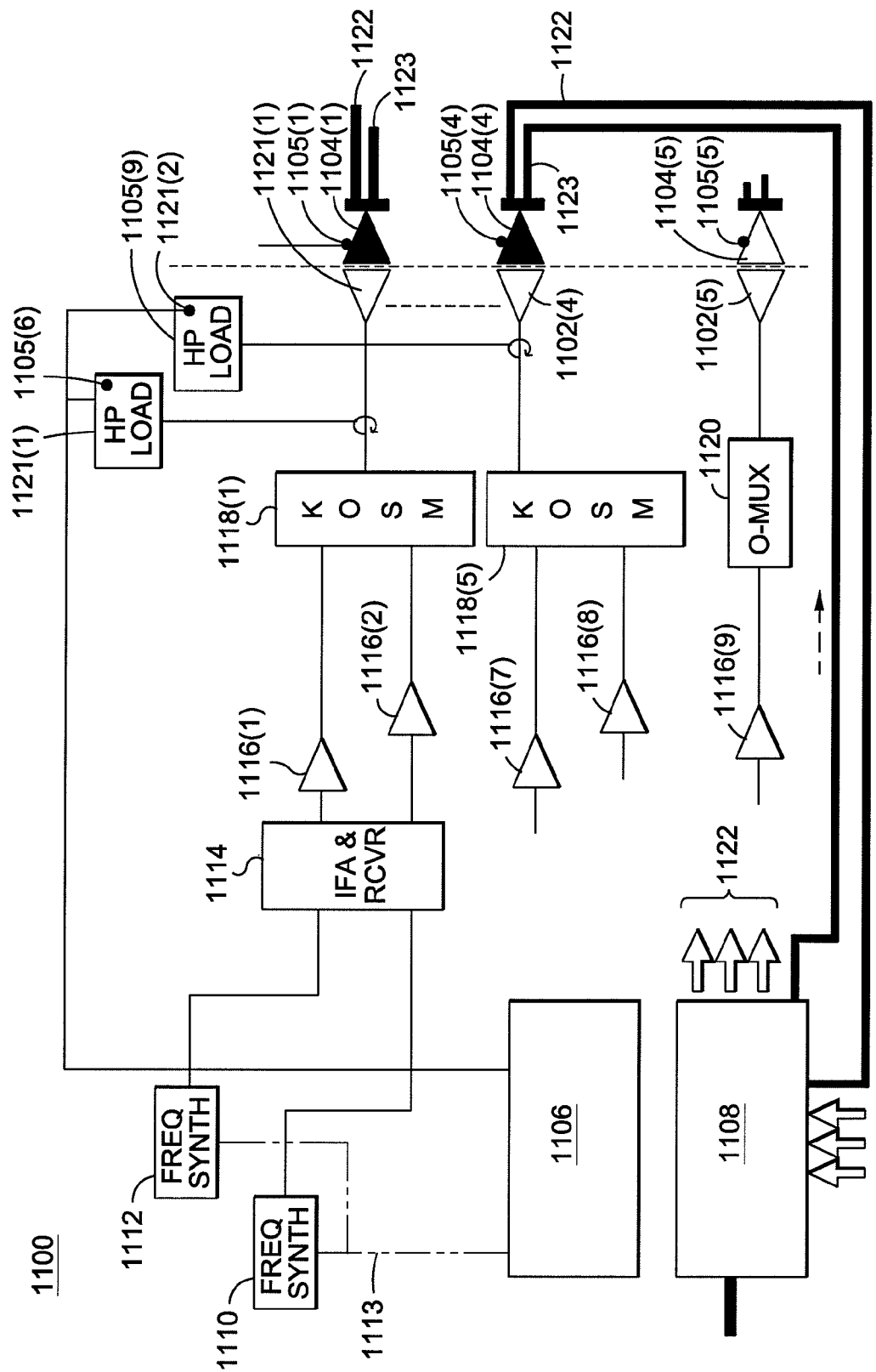
FIG. 11 depicts a system block diagram of a configuration of pick-up horns as used for testing multiple flight horns according to a further embodiment of the present invention.

FIG. 11 depicts a block diagram of a pick-up horn testing system 1100 for testing flight horns/payloads according to a further embodiment of the present invention. One or more flight horns 1102(1)-1102(5), such as those of a particular antenna payload, can be configured in suitable proximity to a like number of pick-up horns 1104(1)-1104(5). Thermal sensors such as thermocouples are connected to the pick-up horns and load plates 1121(1)-1121(4) of the flight horns. The thermal sensors can be connected to a data logging/acquisition system including a processor/computer 1106 for temperature monitoring during TVAC testing. Suitable input filter assembly (IFA) and receivers 1114, may be used with traveling wave tube amplifiers 1116(1)-1116(9) and output switching functionality, e.g., Ka-band output switch matrix (KOSM) 1118(1)-1118(2) and/or output multiplexer (O-MUX) 1120 to operate the flight horns 1102(1)-1102(5) for such testing. One or more suitable frequency synthesizers 1110, 1112 can be used to supply drive signals for the flight horns 1102(1)-1102(5). Each pick-up horn, e.g., 1104(1) can be a GPUH, such as shown and described for FIG. 9, or a PUH, such as shown and described for FIG. 1

A cooling system may be included and can include a control system 1108 and may utilize a suitable coolant, e.g., a liquid/gas nitrogen system or a fluorine based coolant such as Fluorinert, such as described previously for FIG. 1, can be used to cool the pick-up horns 1104(1)-1104(5). The coolant can circulate within tubing/piping 1122 and 1123.

System 1100 can employ or be used as a reflected power fail-safe scheme. System 1100 can operate autonomously from other systems and can be totally automatic. System 100 can include an automatic shutdown feature/functionality. A computer/processor (such as a PC) running software with suitable process monitoring functionality (such as LabView made available by National Instruments) can be used to monitor a number of thermocouples, e.g., 1105(1)-1105(5) for excessive temperature of the pick-up horn 1104(1)-1104(5).

During high-power TVAC testing of the flight horns 1102(1)-1102(5), the thermocouples 1105(1)-1105(5) can be monitored at desired intervals/time periods, e.g., every 30 seconds. When a pre-determined or selected number of thermocouples exceed a temperature set point, a shutdown signal may be generated by the computer/processor 1106 and sent to the frequency synthesizers 1110, 1112 driving the tested flight horns 1102(1)-1102(5).

In the event, one or more of the thermocouples, which as shown by 1105(6)-1105(9) can also be used to measure temperature of high power loads 1121(1)-1121(4) associated with the flight horns, the synthesizer outputs can be turned off—eliminating the RF drive signals into the pickup horns and thereby reducing the reflected power into the payload. When a shutdown signal is sent/generated, an audible and/or visual alarm, or other alarm signal, at a thermal monitoring station/system, can be generated e.g., to alert appropriate personnel.

FIGS. 12A and 12B depict calculated mode and power distributions for a generic pick-up horn, GPUH, similar to the embodiment of FIG. 9. The higher-order mode (HOM) power distribution among the modes and slots is given in FIG. 12A in table 1200A. Each of the four slots indicated was over-moded in order to make the GPUH less sensitive to polarization and to increase the power handling capability. As shown, the power in the central two slots is about 46% each and the edge slots have about 3.3% each. The modes in the slotted region are TE10, TE30, TE11, and TM11. The percent power absorbed by the GPUH regions receiving power is indicated table 1200B in FIG. 12B using cosine squared distribution.

Figure 14:
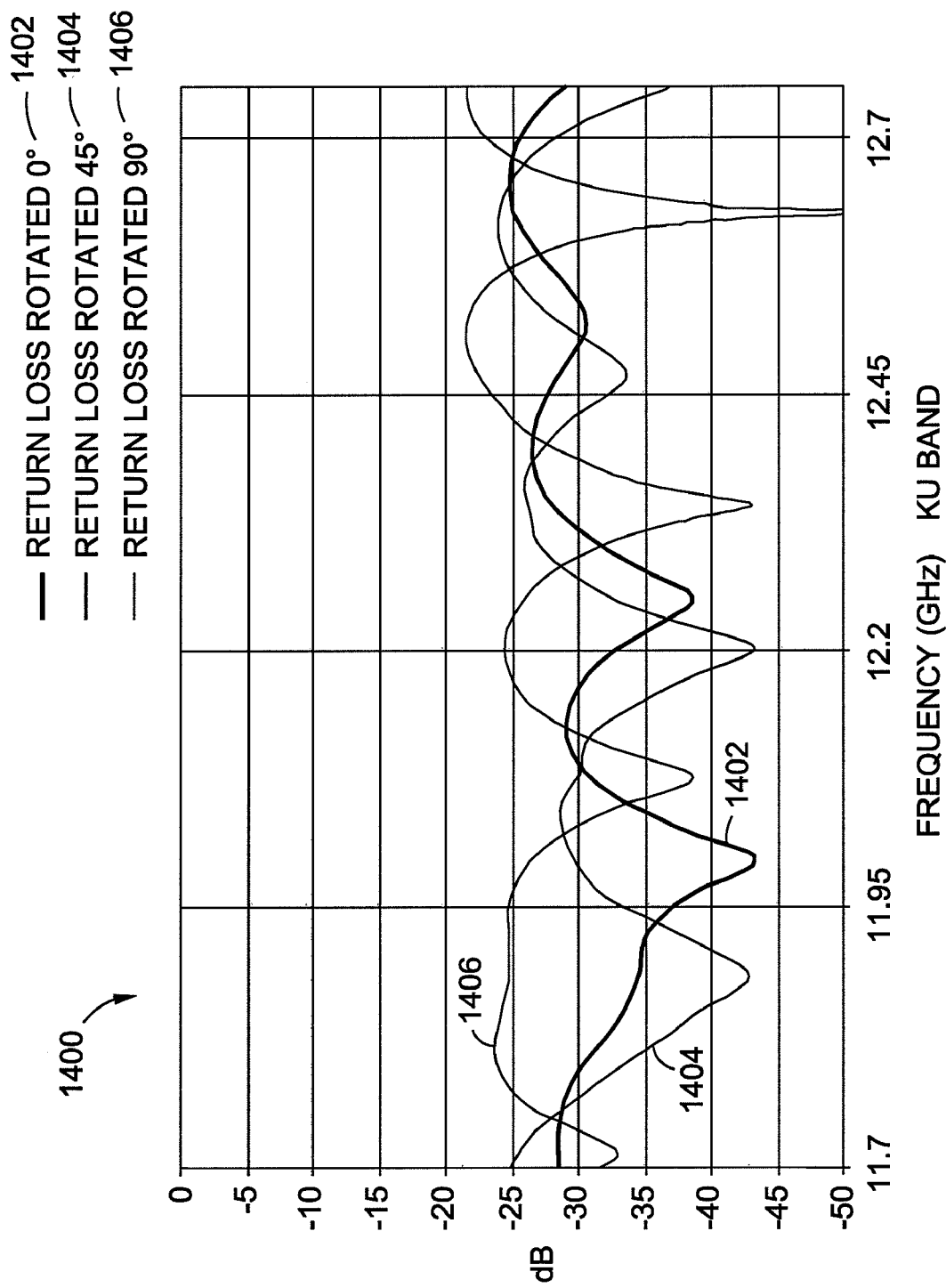
FIG. 14 shows a graph of measured return loss of the generic pick-up horn of FIG. 9 configured with a flight horn operating at Ku band for three different polarization orientations.

FIG. 13 shows a graph 1300 of measured RF leakage at two worst case locations of the generic pick-up horn of FIG. 9 coupled to a flight horn; The RF leakage of the GPUH when aligned with the flight horn has been measured with an open-ended wave guide probe at two different worst case locations that has the highest leakage as shown in FIG. 14. The RF leakage is lower than −55 dBc.

FIG. 14 shows a graph 1400 of measured return loss of an experimental embodiment of GPUH 900 of FIG. 9 configured with a flight horn operating at Ku band. The GPUH was shown to provide measured return loss (with a Sirius-4 flight horn) with extremely low RF leakage (e.g., better than −55 dBc) as shown in FIG. 13.

In FIG. 14, measured return loss of the GPUH is indicated when both the polarizations are aligned 1402 (phi=0 deg.), when PUH is 45 deg. rotated relative to flight horn polarization 1404 (phi=45 deg.), and when both polarizations are perpendicular to each other representing the worst case 1406 (phi=90 deg.). The measured return loss is better than 25 dB (as predicted) when the polarization of GPUH is aligned with the flight horn and deteriorates slightly to 21.5 dB when the GPUH polarization is orthogonal to the flight horn. The measured return loss is better than 20 dB for both senses of circular polarization (RHCP and LHCP).

Figure 15:
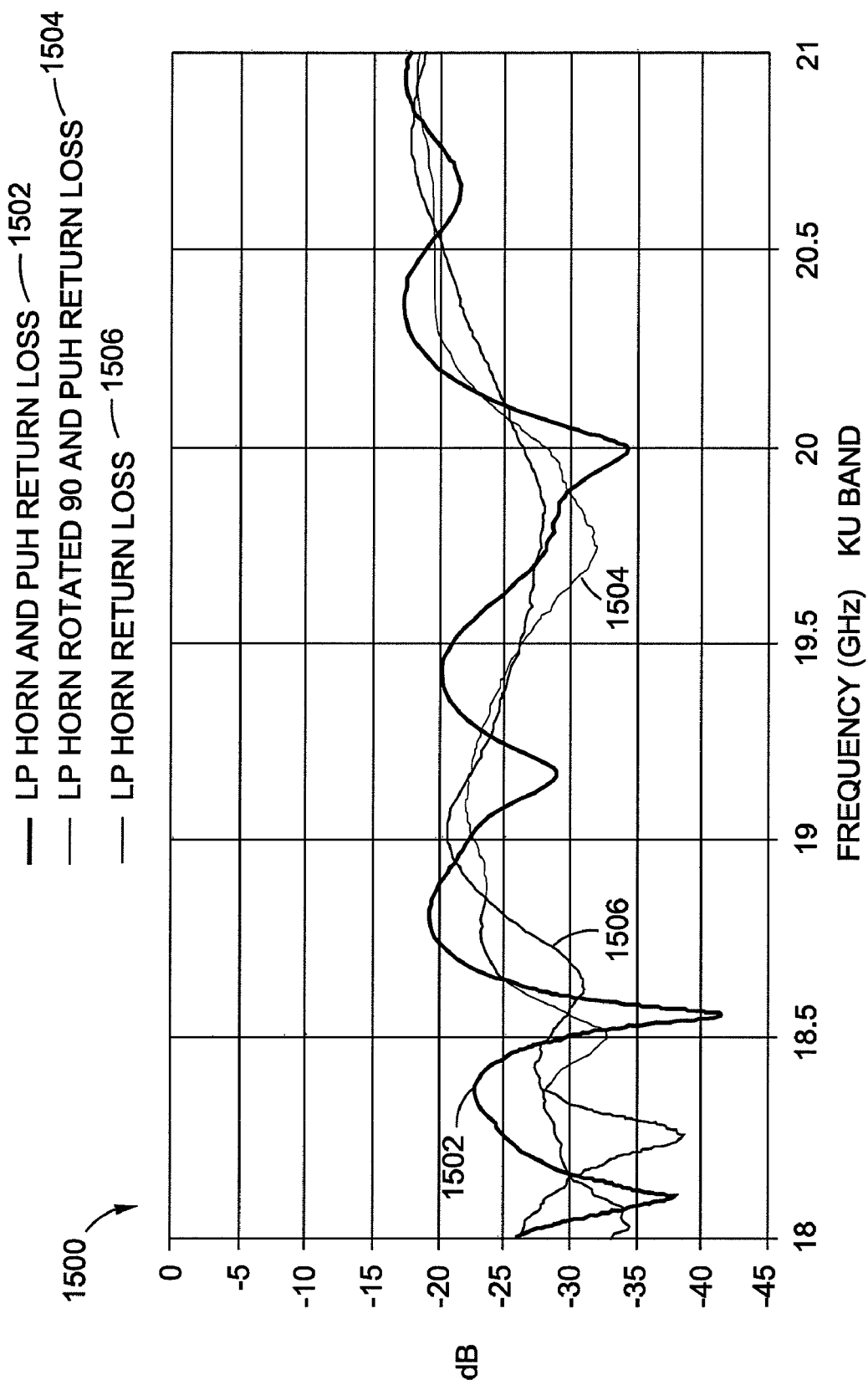
FIG. 15 shows a graph of measured return loss of the generic pick-up horn of FIG. 9 configured with a flight horn operating at Ka band for two polarization orientations.

FIG. 15 shows a graph 1500 of measured return loss of the GPUH of FIG. 9 configured with a flight horn operating at Ka band. The return loss of the horn and GPUH when polarizations (LP Horn) were aligned is indicated at 1502. The return loss of the horn and GPUH when polarizations (LP Horn) were out of alignment by 90 degrees is indicated at 1504. The return loss of the horn alone is indicated at 1506. As shown, the return loss was better than 18 dB over the Ka-band transmit frequencies.

Figure 16:
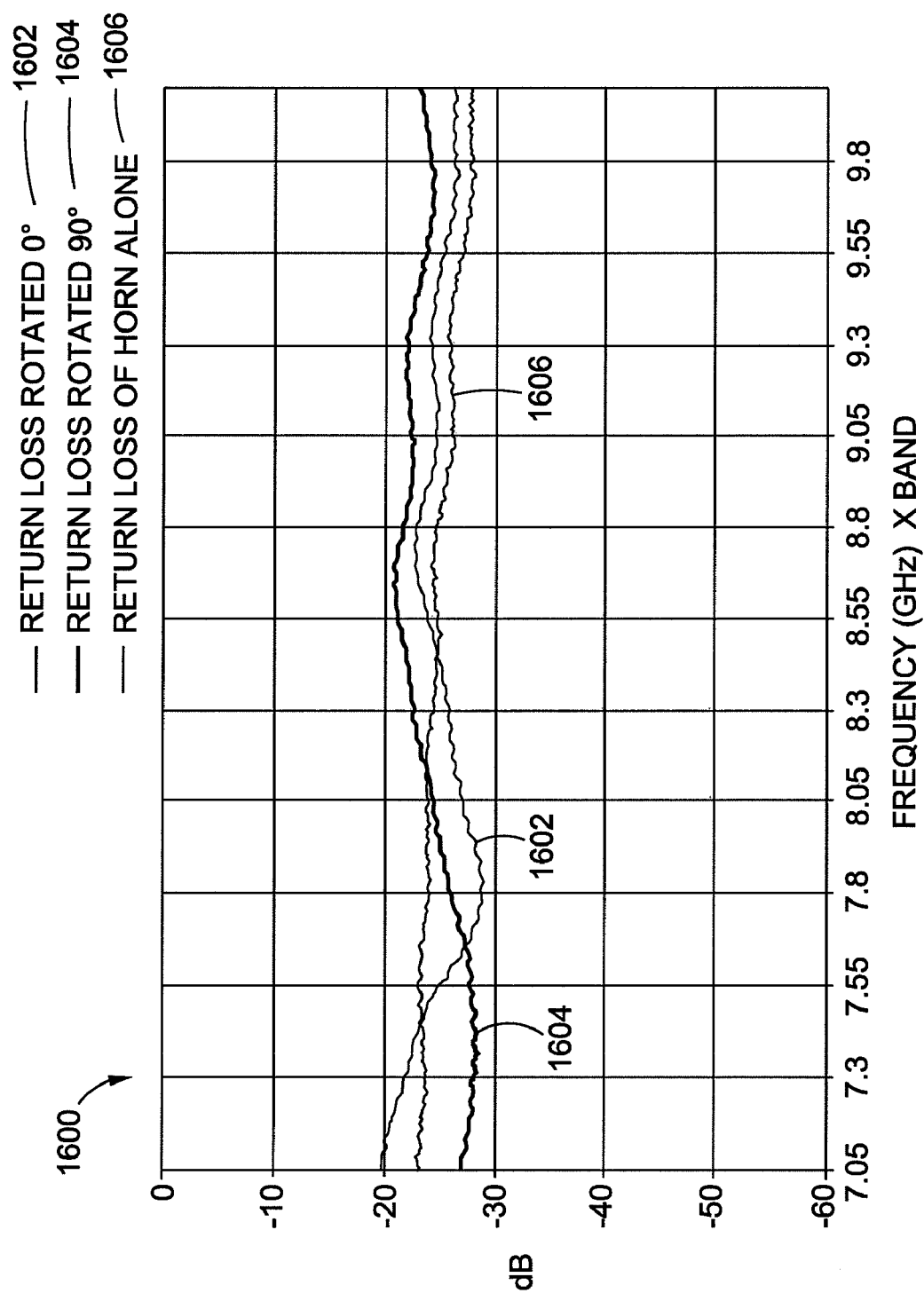
FIG. 16 shows a graph of measured return loss of the generic pick-up horn of FIG. 9 when configured with a flight horn operating at X band for two polarization orientations

FIG. 16 shows a graph 1600 of measured return loss of the generic pick-up horn of FIG. 9 when configured with a flight horn operating at X band. The return loss of the horn and GPUH when polarizations were aligned is indicated at 1602. The return loss of the horn and GPUH when polarizations were out of alignment by 90 degrees is indicated at 1604. The return loss of the horn alone is indicated at 1606. The measured return loss is better than 20 dB over the 7.0 GHz to 10 GHz band.

Figure 17:
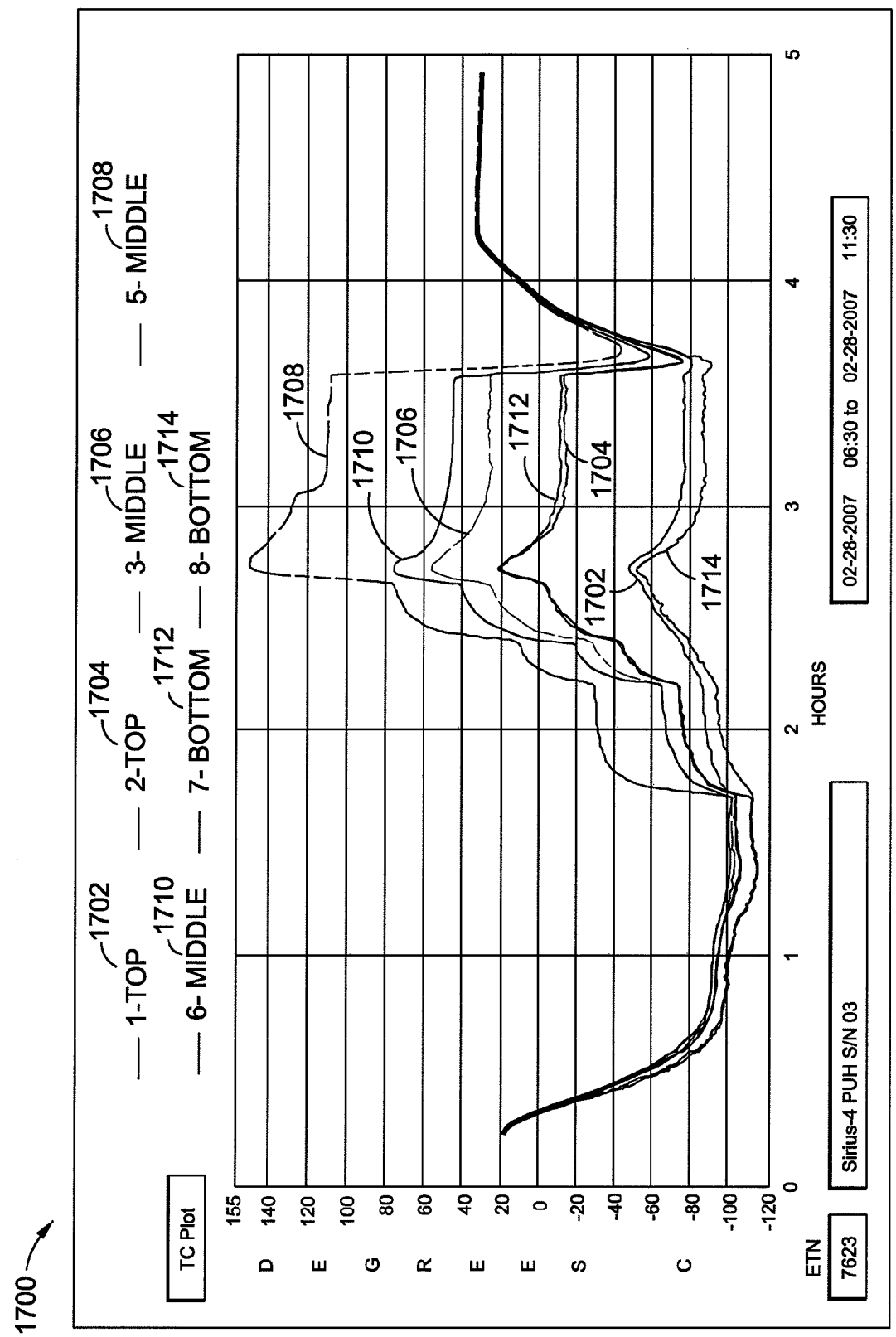
FIG. 17 shows a graph of measured thermal data of the generic pick-up horn of FIG. 9 coupled to a flight horn operating with 1300 Watts of RF power.

FIG. 17 shows a graph 1700 of measured thermal data of an embodiment of GPUH 900 of FIG. 9 coupled to a flight horn operating with 1300 Watts of RF power. The thermal profile of the GPUH was monitored at various RF power levels through the thermo-couples in the associated thermal vacuum chamber. The thermal tracks for seven locations are indicated: two top locations 1702 and 1704; three middle locations, 1706, 1708, and 1710; and two bottom locations, 1712 and 1714.

A LN2/GN2 (nitrogen liquid/gas system) coolant was used to transfer the heat outside the chamber during high power test. The maximum temperature of 148 deg. C. and minimum temperature of −110 deg. C. are well within the allowable limits of the GPUH loads and the bonding film/epoxy used to secure the high-power absorbing loads in the GPUH.

Figure 18:
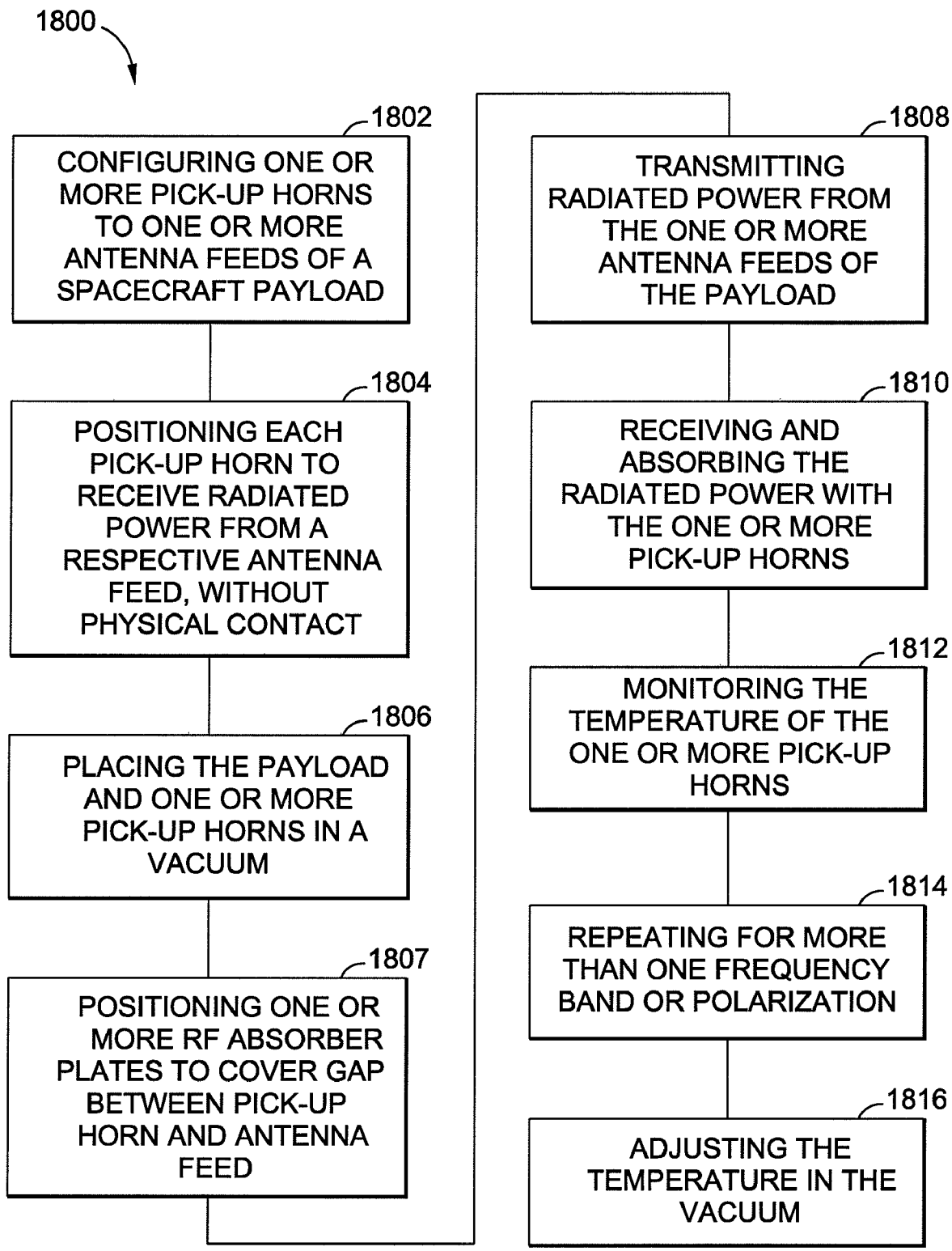
FIG. 18 depicts a method of testing one or more flight horns with a corresponding number of pick-up horns at multiple polarizations and multiple frequency bands, in accordance with a further embodiment of the present invention.

FIG. 18 depicts a method 1800 of testing one or more flight horns or antenna feeds with a corresponding number of pick-up horns, in accordance with a further embodiment of the present invention. One or more pick-up horns can be configured in proximity to one or more antenna feeds of a spacecraft payload, as described at 1802. Each pick-up horns can be positioned to receive radiated power from a respective antenna feed, without physically contacting the respective antenna feed, as described at 1804.

Continuing with the description of method 1800, the payload and the one or more pick-up horns can be placed in a vacuum, as described at 1806. Each pick-up horn can be attached with RF absorber plates to cover the gap between the PUH and the flight horn to minimize RF leakage going outside, as described at 1807. The one or more antenna feeds of the payload can be caused to transmit RF power, as described at 1808. The radiated power can be received with the one or more pick-up horns, as described at 1810. The received power is absorbed in the large and small loads placed in various chambers of the PUH and the temperature of the one or more pick-up horns can be monitored at various locations of the PUH using thermal sensors, as described at 1812. The temperature of load plates of the flights horns may also be monitored. The power to the one or more antenna feeds can be reduced or cut off in the event the temperature one or more of the pick-up horns exceeds a specified or pre-determined threshold value or set point. The steps described in 1808, 1810, and 1812 can be repeated for more than one polarization and/or more than one frequency band, as described in 1814. Method 1800 can also include heating and/or cooling the test environment of the flight horns to raise and/or lower the temperature that the flight horns are subject to, as described at 1816.

Accordingly, aspects and embodiment of the present invention can provide advantages over the prior art. For example, generic pick-up horns according to the present invention can have a very large bandwidth ratio, e.g., of 3:1, covering, e.g., X-band, Ku-band, and Ka-band payloads. Moreover, pick-up horn designs can allow for testing of payloads with varying horn sizes, such as those in single reflector and dual-reflector antenna systems. Moreover, GPUH techniques further enjoy an insensitivity to polarization, thus permitting testing of various polarizations such as VP, HP, LHCP, RHCP, or any other arbitrary polarization. Moreover, the techniques of the present invention can be used to test payloads without the need for de-mating and mating operations of flight hardware. Pick-up horn and GPUH techniques can provide excellent matching by employing small low-power absorbing loads in addition to large high-power absorbing loads, in order to minimize reflections from metallic walls. Finally, the GPUH can handle high power handling (e.g., in excess of 3000 watts).

Techniques according to the present invention also offer the following advantages relative to the prior art: no RF power goes outside the TVAC chamber through critical RF window; no complicated RF plumbing is required; breaking the vacuum to test multiple payloads on the spacecraft is not required; significantly faster and cheaper compared to conventional methods; less sensitive to alignment, polarization, and bandwidth: and, lower risk of multipaction power breakdown.

While the present exemplary embodiments have been described with reference to high power thermal vacuum testing, the scope of the present invention is not limited to this arrangement. Rather, pick-up horns of the present invention (including GPUHs) may be used for open-door testing (e.g., at ambient pressures), for low-power testing, or for any other arrangement in which a transmit antenna is tested. Moreover, while embodiments and aspects of the present invention have been described with respect to certain frequencies and bands of antenna transmitter or feed operation, others may be utilized within the scope of the present invention.

The present invention has been particularly described with reference to the various figures and embodiments, however, it should be understood that these are for illustration purposes only and should not be taken as limiting the scope of the invention. There may be many other ways to implement the invention. Many changes and modifications may be made to the invention, by one having ordinary skill in the art, without departing from the spirit and scope of the invention.

What is claimed is:

1. A generic pick-up horn for absorbing radiation emitted by a transmit antenna at one or more frequency bands and at one or more polarizations, the pick-up horn comprising:
   at least one outer metal wall forming a metal body;
   at least one interior surface disposed in the metal body and forming at least one chamber in the metal body;
   a front metal surface disposed at a front end of the metal body, and having at least one sized opening corresponding and connected to the at least one chamber;
   at least one high-power absorbing load disposed within at least one chamber and configured and arranged to conduct heat to the at least one interior surface, wherein the at least one high-power absorbing load substantially covers a back surface of the at least one chamber;
   and a coolant path disposed within the metal body, the coolant path including a coolant inlet and a coolant outlet, each of which is disposed on an outer surface of the at least one outer metal wall.

2. The pick-up horn of claim 1, wherein the coolant path is a serpentine coolant path disposed between an outer surface of the at least one outer metal wall and the high-power absorbing loads.

3. The pick-up horn of claim 1, further comprising at least one thermal sensor coupled to the high-power absorbing loads.

4. The pick-up horn of claim 1, further comprising at least one vent hole for providing an outgas sing path between an outer surface of the at least one outer metal wall and the at least one interior surfaces.

5. The pick-up horn of claim 1, further comprising a radio frequency-transparent debris shield disposed over the front metal surface.

6. The pick-up horn of claim 1, further comprising a shroud including four metallic plates having their inner surfaces attached with ceramic loads that are configured and arranged to cover a gap between the pick-up horn and the antenna for testing.

7. The pick-up horn of claim 1, wherein the at least one chamber comprises a plurality of equally sized chambers.

8. The pick-up horn of claim 1, wherein the at least one opening is sufficiently large to accommodate any polarization of the radiation emitted by the antenna.

9. The pick-up horn of claim 1, wherein the at least one opening is sufficiently large to accommodate a plurality of higher order modes of the radiation emitted by the antenna.

10. The pick-up horn of claim 1, wherein the at least one opening is rectangular in shape.

11. The pick-up horn of claim 1, wherein the at least one high-power absorbing load is substantially wedge-shaped.

12. The pick-up horn of claim 1, wherein the pick-up horn is configured and arranged to receive Ka band radiation.

13. The pick-up horn of claim 1, wherein the pick-up horn is configured and arranged to receive Ku band radiation.

14. The pick-up horn of claim 1, wherein the pick-up horn is configured and arranged to receive X band radiation.

15. The pick-up horn of claim 1, wherein the pick-up horn is configured and arranged to receive radiation over a range of 7 GHz to 21 GHz.

16. The pick-up horn of claim 1, wherein the pick-up horn is substantially RF-transparent to the antenna while absorbing the radiation emitted by the antenna.

17. The pick-up horn of claim 1, further comprising one or more absorbing loads disposed on a side wall of the interior surface.

18. The pick-up horn of claim 1, further comprising absorbing loads disposed on one or more edges between the at least two openings.

19. The pick-up horn of claim 1, wherein the at least two chambers are configured and arranged to support TE10, TE30, TE11, and/or TM11 modes of the antenna during testing.

20. The pick-up horn of claim 1, wherein the pick-up horn has a bandwidth ratio of 3:1.

21. The pick-up horn of claim 1, wherein the at least one chamber comprises a plurality of chambers and wherein exposed metal surfaces separating the chambers are covered with small absorber load caps.

22. A system for testing one or more payload antenna feeds of a spacecraft payload, the system comprising:
   one or more antenna feeds, each antenna feed having an opening and configured to receive an RF drive signal and to radiate RF power through the respective opening in response to received RF drive signal;
   one or more frequency synthesizers configured to output one or more RF drive signals to drive the one or more antenna feeds;
   one or more pick-up horns for absorbing radiated power of the one or more antenna feeds, each pick-up horn comprising:
      a metal body having two or more chambers therein and two or more openings corresponding and connected to the two or more chambers and facing at least one of the openings of the one or more antenna feeds;
      at least one high-power absorbing load disposed within each of the two or more chambers;
      a cooling channel disposed in the metal body to remove heat from the body; and
   a thermal sensor configured and arranged to detect a temperature associated with at least one of the high-power absorbing loads of the one or more pick-up horns and to output a temperature signal indicative of the temperature associated with the at least one of the high-power absorbing loads; and
   a processor configured and arranged to receive the temperature signal from the thermal sensor and to reduce the one or more RF drive signals of the frequency synthesizers based on the received temperature signal, wherein radiated RF power of the one or more antenna feeds can be reduced.

23. The system of claim 22, wherein the coolant path is a serpentine coolant path disposed between an outer surface of the at least one outer metal wall and the high-power absorbing loads.

24. The system of claim 22, wherein the pick-up horn comprises a shroud including four metallic plates having inner surfaces attached with ceramic loads configured and arranged to cover a gap between the pick-up horn and the antenna for testing.

25. The system of claim 22, wherein the pick-up horn comprises at least one vent hole for providing an outgas sing path between an outer surface of the at least one outer metal wall and the at least two interior surfaces.

26. The system of claim 25, wherein the at least one vent hole comprises 32 vent holes.

27. The system of claim 22, wherein the two or more openings are sufficiently large to accommodate any polarization of the radiation emitted by an antenna under test.

28. The system of claim 22, wherein the two openings are sufficiently large to accommodate a plurality of higher order modes of the radiation emitted by the antenna.

29. The system of claim 22, wherein the two or more openings are rectangular in shape.

30. The system of claim 22, wherein the at least one high-power absorbing load is substantially wedge-shaped.

31. The system of claim 22, wherein one or more pick-up horns is configured and arranged to receive Ka band radiation.

32. The system of claim 22, wherein one or more pick-up horns is configured and arranged to receive Ku band radiation.

33. The system of claim 22, wherein one or more pick-up horns is configured and arranged to receive X band radiation.

34. The system of claim 22, wherein one or more pick-up horns is configured and arranged to receive radiation over a range of 7 GHz to 21 GHz.

35. The system of claim 22, wherein 23, wherein one or more pick-up horns is substantially RF-transparent to the antenna while absorbing the radiation emitted by the antenna.

36. The system of claim 22, further comprising one or more absorbing loads disposed on a side wall of the interior surface of a the pick-up horn.

37. The system of claim 22, further comprising absorbing loads disposed on one or more edges between the two or more openings.

38. The system of claim 22, wherein the two or more chambers are configured and arranged to support TE10, TE30, TE11, and/or TM11 modes of an antenna during testing.

39. The system of claim 22, wherein one or more of the pick-up horns has a bandwidth ratio of 3:1.

40. The system of claim 22, further comprising a coolant system connected to the cooling channel of each pick-up horn and operational to supply a coolant to and receive heat from each pick-up horn.

41. The system of claim 22, wherein exposed metal surfaces separating the chambers of one or more pick-up horns are covered with small absorber load caps.

42. A method of testing a payload antenna feed using a pick-up horn comprising a high-load absorber and positioned in proximity to the antenna feed, the method comprising:
   driving the antenna feed with an RF drive signal to cause the antenna feed to radiate RF power;
   absorbing the radiated RF power with the pick-up horn;
   monitoring the temperature of the pick-up horn; and
   controlling the RF drive signal to the antenna feed to reduce the radiated RF power in the event the monitored temperature of the pick-up horn exceeds a specified value.

43. The method of claim 42, further comprising testing payload antenna feed RF parameters of amplitude variation or group delay.

44. The method of claim 43, further comprising heating or cooling the payload antenna feed.

* * * * *

UNITED STATES PATENT AND TRADEMARK OFFICE
CERTIFICATE OF CORRECTION

PATENT NO. : 7,750,859 B2
APPLICATION NO. : 12/016930
DATED : July 6, 2010
INVENTOR(S) : Sudhakar K. Rao et al.

It is certified that error appears in the above-identified patent and that said Letters Patent is hereby corrected as shown below:

In Column 15, line 35: Replace "outgas sing", with --outgassing--.

In Column 16, line 63: Replace "outgas sing", with --outgassing--.

Signed and Sealed this
Twenty-third Day of August, 2011

David J. Kappos
*Director of the United States Patent and Trademark Office*